(12) United States Patent
Mathuriya et al.

(10) Patent No.: US 11,750,197 B1
(45) Date of Patent: Sep. 5, 2023

(54) AND-OR-INVERT LOGIC BASED ON A MIX OF MAJORITY OR MINORITY LOGIC GATE WITH NON-LINEAR INPUT CAPACITORS AND OTHER LOGIC GATES

(71) Applicant: Kepler Computing Inc., San Francisco, CA (US)

(72) Inventors: Amrita Mathuriya, Portland, OR (US); Rafael Rios, Austin, TX (US); Ikenna Odinaka, Durham, NC (US); Darshak Doshi, Sunnyvale, CA (US); Rajeev Kumar Dokania, Beaverton, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 0 days.

(21) Appl. No.: 17/659,981

(22) Filed: Apr. 20, 2022

(51) Int. Cl.
*H03K 19/23* (2006.01)
(52) U.S. Cl.
CPC .................................. *H03K 19/23* (2013.01)
(58) Field of Classification Search
CPC ........................................................ H03K 19/23
See application file for complete search history.

(56) References Cited

U.S. PATENT DOCUMENTS

| 3,108,193 | A | * | 10/1963 | Schreiner | ............... | G11C 19/12 |
|  |  |  |  |  |  | 365/77 |
| 3,260,863 | A |  | 7/1966 | Burns et al. |  |  |
| 3,524,977 | A |  | 8/1970 | Wang |  |  |
| 5,381,352 | A | * | 1/1995 | Shou | ..................... | H03M 1/804 |
|  |  |  |  |  |  | 708/7 |

(Continued)

FOREIGN PATENT DOCUMENTS

| JP | 2000156472 A | 6/2000 |
| KR | 20160089141 A | 7/2016 |
| KR | 20170099862 A | 9/2017 |

OTHER PUBLICATIONS

"Kepler Logic", Named for Amalie Emmy Noether @ https://en.wikipedia.org/wiki/Emmy_Noether. Downloaded from internet on Jan. 10, 2020.

(Continued)

*Primary Examiner* — Kurtis R Bahr
(74) *Attorney, Agent, or Firm* — MUGHAL GAUDRY & FRANKLIN PC

(57) ABSTRACT

A class of complex logic gates are presented that use non-linear polar material. The logic gates include multi-input majority gates. At least one input to an individual multi-input majority gate is a fixed input. Other inputs are driven to non-linear input capacitors on their respective first terminals. The second terminals of the non-linear input capacitors are coupled a summing node, which provides a majority function of the inputs. The summing node is coupled to a CMOS logic. Leakage through the capacitors is configured such that capacitors of a majority gate have substantially equal leakage, and this leakage has a I-V behavior which is symmetric. As such, reset device(s) on the summing node are not used. The non-linear charge response from the non-linear input capacitors results in output voltages close to or at rail-to-rail voltage levels, which reduces the high leakage problem faced from majority gates that use linear input capacitors.

20 Claims, 23 Drawing Sheets

(56) References Cited

U.S. PATENT DOCUMENTS

| | | | |
|---|---|---|---|
| 5,818,380 A | 10/1998 | Ito et al. | |
| 5,835,045 A | 11/1998 | Ogawa et al. | |
| 5,926,057 A | 7/1999 | Ogawa et al. | |
| 5,978,827 A * | 11/1999 | Ichikawa | H03K 19/23 708/626 |
| 6,043,675 A * | 3/2000 | Miyamoto | H03M 1/145 326/11 |
| 6,166,583 A | 12/2000 | Kochi et al. | |
| 6,198,652 B1 | 3/2001 | Kawakubo et al. | |
| 6,208,282 B1 | 3/2001 | Miyamoto | |
| 7,837,110 B1 | 11/2010 | Hess et al. | |
| 7,897,454 B2 | 3/2011 | Wang et al. | |
| 8,247,855 B2 | 8/2012 | Summerfelt | |
| 9,276,040 B1 | 3/2016 | Marshall et al. | |
| 9,305,929 B1 | 4/2016 | Karda et al. | |
| 9,324,405 B2 | 4/2016 | Evans, Jr. et al. | |
| 9,697,882 B1 | 7/2017 | Evans, Jr. et al. | |
| 9,858,979 B1 | 1/2018 | Derner et al. | |
| 9,973,329 B2 | 5/2018 | Hood et al. | |
| 10,217,522 B2 | 2/2019 | Wang et al. | |
| 10,446,214 B1 | 10/2019 | Vincenzo et al. | |
| 10,679,782 B2 | 6/2020 | Manipatruni et al. | |
| 11,043,259 B2 | 6/2021 | Wentzlaff et al. | |
| 11,374,575 B1 * | 6/2022 | Dokania | H01L 28/55 |
| 2001/0052619 A1 * | 12/2001 | Inoue | H01L 27/1211 257/347 |
| 2002/0163058 A1 | 11/2002 | Chen et al. | |
| 2004/0183508 A1 | 9/2004 | Toyoda et al. | |
| 2009/0058460 A1 | 3/2009 | Kang | |
| 2012/0107965 A1 | 5/2012 | Sashida | |
| 2013/0057301 A1 | 3/2013 | Balachandran et al. | |
| 2015/0337983 A1 | 11/2015 | Dolenti et al. | |
| 2017/0243917 A1 | 8/2017 | Manipatruni et al. | |
| 2017/0337983 A1 | 11/2017 | Wang et al. | |
| 2018/0025766 A1 | 1/2018 | Dietrich et al. | |
| 2018/0076815 A1 | 3/2018 | Vigeant et al. | |
| 2018/0240583 A1 | 8/2018 | Manipatruni et al. | |
| 2019/0051812 A1 | 2/2019 | Shih et al. | |
| 2019/0074295 A1 | 3/2019 | Schröder | |
| 2019/0318775 A1 | 10/2019 | Rakshit et al. | |
| 2019/0348098 A1 | 11/2019 | El-Mansouri et al. | |
| 2020/0051607 A1 | 2/2020 | Pan et al. | |
| 2020/0091407 A1 | 3/2020 | Liu et al. | |
| 2020/0091414 A1 | 3/2020 | Liu et al. | |
| 2020/0210233 A1 | 7/2020 | Chen et al. | |
| 2021/0203325 A1 * | 7/2021 | Manipatruni | H03K 19/21 |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Final Office Action dated Dec. 9, 2021 for U.S. Appl. No. 17/327,614.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Non-Final Office Action dated Jan. 24, 2022 for U.S. Appl. No. 17/327,648.

Non-Final Office Action dated Jan. 24, 2022 for U.S. Appl. No. 17/327,649.

Non-Final Office Action dated Jan. 24, 2022 for U.S. Appl. No. 17/327,659.

Non-Final Office Action dated Nov. 16, 2021 for U.S. Appl. No. 17/327,614.

Notice of Allowance dated Dec. 7, 2021 for U.S. Appl. No. 17/327,652.

Notice of Allowance dated Jan. 12, 2021 for U.S. Appl. No. 17/327,614.

Notice of Allowance dated Jan. 28, 2022 for U.S. Appl. No. 17/327,651.

Notice of Allowance dated Mar. 7, 2022 for U.S. Appl. No. 17/327,659.

Notice of Allowance dated Mar. 11, 2022 for U.S. Appl. No. 17/327,648.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

International Search Report & Written Opinion dated May 19, 2022 for PCT Patent Application No. PCT/US2022/070445.

Non-Final Office Action dated Apr. 6, 2023 for U.S. Appl. No. 17/659,992.

Non-Final Office Action dated Apr. 14, 2023 for U.S. Appl. No. 17/327,662.

Non-Final Office Action dated Dec. 12, 2022 for U.S. Appl. No. 17/808,290.

Non-Final Office Action dated Mar. 16, 2023 for U.S. Appl. No. 17/327,660.

Notice of Allowance dated Apr. 13, 2023 for U.S. Appl. No. 17/327,660.

Notice of Allowance dated Apr. 28, 2022 for U.S. Appl. No. 17/327,649.

Notice of Allowance dated Feb. 2, 2023 for U.S. Appl. No. 17/552,079.

Notice of Allowance dated Feb. 17, 2023 for U.S. Appl. No. 17/808,290.

Notice of Allowance dated Jan. 30, 2023 for U.S. Appl. No. 17/550,910.

Notice of Allowance dated Jan. 31, 2023 for U.S. Appl. No. 17/552,101.

Notice of Allowance dated Mar. 7, 2023 for U.S. Appl. No. 17/550,908.

Notice of Allowance dated Mar. 13, 2023 for U.S. Appl. No. 17/552,107.

Notice of Allowance dated Mar. 17, 2023 for U.S. Appl. No. 17/552,247.

Notice of Allowance dated May 1, 2023 for U.S. Appl. No. 17/659,992.

Notice of Allowance dated May 15, 2023 for U.S. Appl. No. 17/327,662.

* cited by examiner ns provided is for of the disclosure.

AND-OR-INVERT LOGIC BASED ON A MIX OF MAJORITY OR MINORITY LOGIC GATE WITH NON-LINEAR INPUT CAPACITORS AND OTHER LOGIC GATES

BACKGROUND

Typical logic gates such as an AND gate, an OR gate, or a logic gate that receives three or more inputs may consist of nine more transistors per logic gate and many interconnects to connect the various transistors. As the number of transistors increases, power consumption also increases. As devices push down the power envelope to save battery power, existing circuit architecture for multi-input logic gates present challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
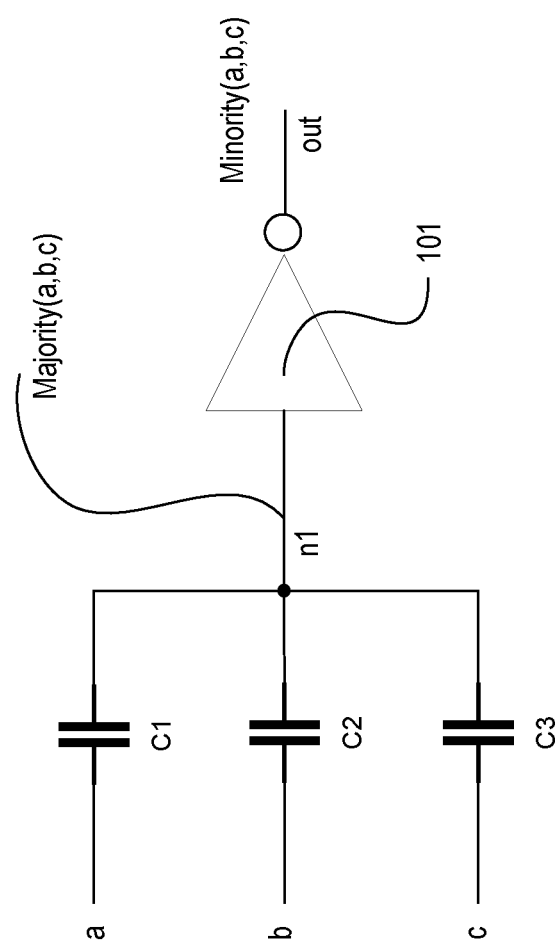
FIG. 1 illustrates a 3-input majority gate using linear input capacitors resulting in non-rail-to-rail voltage swing at an input of a driver and leakage through the driver.

Some embodiments describe a new class of logic gates that use non-linear polar material. The logic gates include multi-input majority or minority gates. Input signals in the form of digital signals are driven to first terminals of capacitors with non-linear polar material. At least one input to an individual multi-input majority gate is a fixed input. Other inputs are driven to non-linear input capacitors on their respective first terminals. The fixed input can be tied to or coupled to a supply rail such as a power supply rail or a ground supply rail. The second terminals of the capacitors with non-linear polar material are coupled to form a majority node (or a summing node). Majority function of the input signals occurs on this node. The majority node (herein also referred to as the summing node) is then coupled to a capacitive node or device such as a gate terminal of a transistor. In various embodiments, this capacitive node is connected to a logic gate such as a CMOS circuitry, buffer, inverter, NAND gate, NOR gate, multiplexer, XOR gate, etc. The output of the logic can be used to drive additional multi-input majority or minority gates or to devices of other types of transistor technologies. The logic gate can be implemented in any suitable technology such as complementary metal oxide semiconductor (CMOS), tunneling field effect transistor (TFET), GaAs based transistors, bipolar junction transistors (BJTs), Bi-CMOS transistors, etc. As such, majority or minority gate of various embodiments can be combined with existing transistor technologies.

In various embodiments, leakage through the capacitors is configured such that capacitors of a majority gate have substantially equal leakage, and this leakage has a I-V (current-voltage) behavior which is symmetric. As such, reset device(s) on the summing node are not used, in accordance with various embodiments. The leakage through the capacitors maintains the majority functionality even for long periods of inactivity. In some examples, the capacitor leakage may maintain the majority functionality permanently, and not for just long periods of time. In various embodiments, the leakage through the capacitors (herein also referred to as the leaky capacitors) of the majority gate causes the majority gate functionality to change from capacitive majority function to resistive majority function. The capacitor leakage creates a resistive majority (herein referred to as R-MAJ) that dominates under steady state and guarantees the majority gate functionality, so no resets are needed. The non-linear capacitances create a capacitive majority (herein referred to as C-MAJ) that dominates under high activity. In various embodiments, under worst case steady-state conditions (e.g., some inputs set to high and some set to low), low margins may develop but the majority function of the gate is maintained by the leaky capacitors. Assuming that the summing node is connected to an inverter. Inverters switch when the input moves across the Vdd/2 voltage level. If the input is less than Vdd/2 the output goes high, and if the input is higher than Vdd/2 the output goes low. The majority gate has to produce a summing node voltage higher or lower than Vdd/2 with enough margin. The higher the margin the better. If margins are low (e.g., few mV above or below Vdd/2), high leakage from supply to ground develops across the inverter. Also, low margins may produce loss of functionality due to threshold voltage variations. In various embodiments, the capacitors of the majority gate are specified to have leakage current (under room temperature) to be high enough to maintain the majority function on the summation node. The worst-case leakage of the capacitors is desired to be limited to a reasonable factor over the leakage of the CMOS circuit which is connected to the summation node.

The non-linear charge response from the non-linear input capacitors results in output voltages close to or at rail-to-rail voltage levels, which reduces the high leakage problem faced from majority gates that use linear input capacitors. In various embodiments, the summing node or the majority node has a signal which reaches closer to rail-to-rail (e.g., from ground to Vdd) resulting in lower leakage in the subsequent logic gate. One drawback of using linear input capacitors, as opposed to non-linear input capacitors, is that the voltage on the summing node or majority output node does not reach rail-to-rail voltage, resulting in high leakage in the output driver or logic gate. Such issues are resolved by the multi-input majority or minority gates of various embodiments. In the multi-input majority or minority gates of various embodiments the non-linear charge response from the non-linear input capacitors results in output voltages close to rail-to-rail. Approaching rail-to-rail as close as possible is a desired goal. Here, in some examples, close to rail-to-rail voltage may mean a voltage which is within 20% of the rail-to-rail level. In some applications and conditions, the output voltage (on summing node) may be more off than rail-to-rail voltage level (e.g., the voltage may be more than 20% but less than 30% of rail-to-rail voltage level) and still give a majority function better than corresponding majority function achieved from a CMOS based majority gate. Bringing the majority output close to rail-to-rail voltage eliminates the high leakage problem faced from majority gates formed using linear input capacitors. As such, the input capacitors with non-linear polar material can drive another capacitive input circuit directly.

There are many technical effects of the various embodiments. For example, extremely compact basic logic gates are formed using non-linear capacitors. The non-linear capacitors comprise non-linear polar material that can be ferroelectric material, paraelectric material, or non-linear dielectric. The logic gates of various embodiments become the basis of adders, multipliers, sequential circuits, and other complex circuits, etc.

The use of leaky capacitors for the majority gates allows the gate to retain the majority function longer than when non-leaky capacitors are used. As such, reset transistors connected to the summing node may be removed. These reset transistors and the controls are used to adjust the charge on the terminals of the input capacitors regularly to maintain proper operation of the majority gate. The leaky capacitors for the majority gate further reduce the area of the logic gate because the reset transistors and their controls can be removed.

The majority gate of various embodiments lowers the power consumption because they do not use switching transistors and the interconnect routings are much fewer than the interconnect routings used in transitional CMOS logic gates. For example, 10× fewer interconnect length is used by the majority gate of various embodiments than traditional CMOS circuits for the same function and performance. The capacitors with non-linear polar material provide non-volatility that allows for intermittent operation and zero power drain when not in use.

For example, a processor having such logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitors with non-linear polar material can be used with any type of transistor. For example, the capacitors with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

It is pointed out that those elements of the figures having the same reference numbers (or names) as the elements of any other figure can operate or function in any manner similar to that described, but are not limited to such.

FIG. 1 illustrates 3-input majority gate 100 using linear input capacitors resulting in non-rail-to-rail voltage swing at an input of a driver and leakage through the driver. 3-input majority gate 100 is a typical majority gate that uses linear input capacitors C1, C2, and C3 that are coupled to inputs a, b, and c, respectively, on one end and to a summing node n1 on another end. The summing node is where the majority function is performed e.g., Majority(a,b,c). The voltage developed on node n1 is then used to drive a CMOS driver 101. If CMOS driver 101 is an inverter, the output "out" provides a minority function of the inputs e.g., Minority(a,b,c). Here, the voltage developed on node n1 is not rail-to-rail voltage. As a result, standby current rushes through driver 101 because some of its transistors are not fully off due to the non-rail-to-rail voltage on node n1. As such, energy is wasted and 3-input majority gate 100 becomes an unsuitable gate for use in any low power applications.

Figure 2:
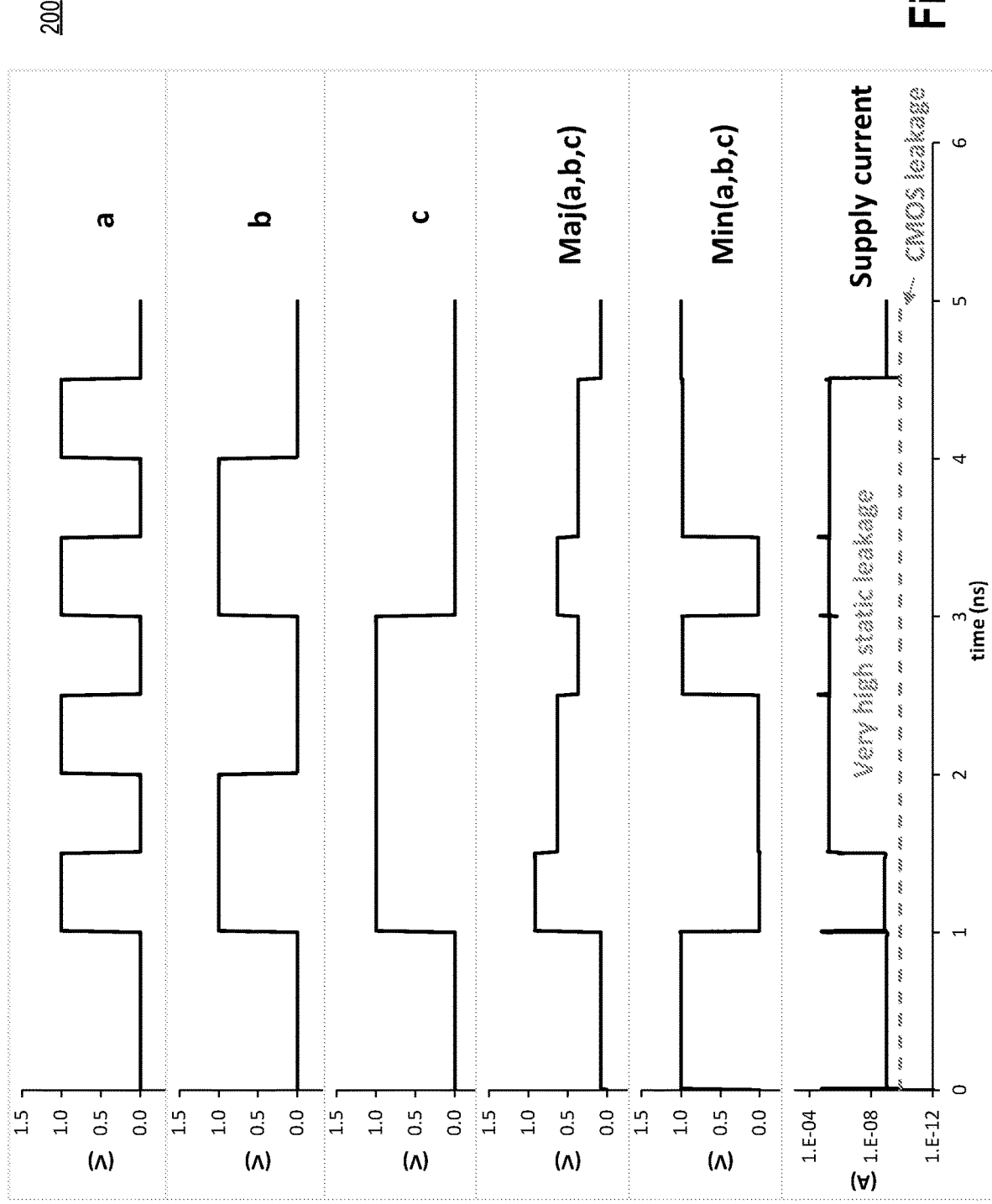
FIG. 2 illustrates a timing diagram showing operation of 3-input majority gate of FIG. 1 resulting in high static leakage.

FIG. 2 illustrates timing diagram 200 showing operation of 3-input majority gate of FIG. 1 resulting in high static leakage. Timing diagram 200 shows digital input signals for inputs a, b, and c. Depending on the logic levels of inputs a, b, and c, a voltage is developed on summing node n1. This voltage is illustrated by waveform Maj(a,b,c). The voltage driven by inverter 101 on node "out" is the minority output, Min(a,b,c). The last waveform in the stack of waveforms shows the impact of using linear input capacitors as the basis of performing a majority function. When the voltage on node n1 is between Vdd and ground, crowbar current (also referred to as standby current) passes through the supply rail to the ground in CMOS driver 101. This crowbar current is substantially larger than leakage current (e.g., current through CMOS driver 101 when all its devices are off). As a result, 3-input majority gate 100 becomes unsuitable gate for use in any low power applications.

Figure 3:
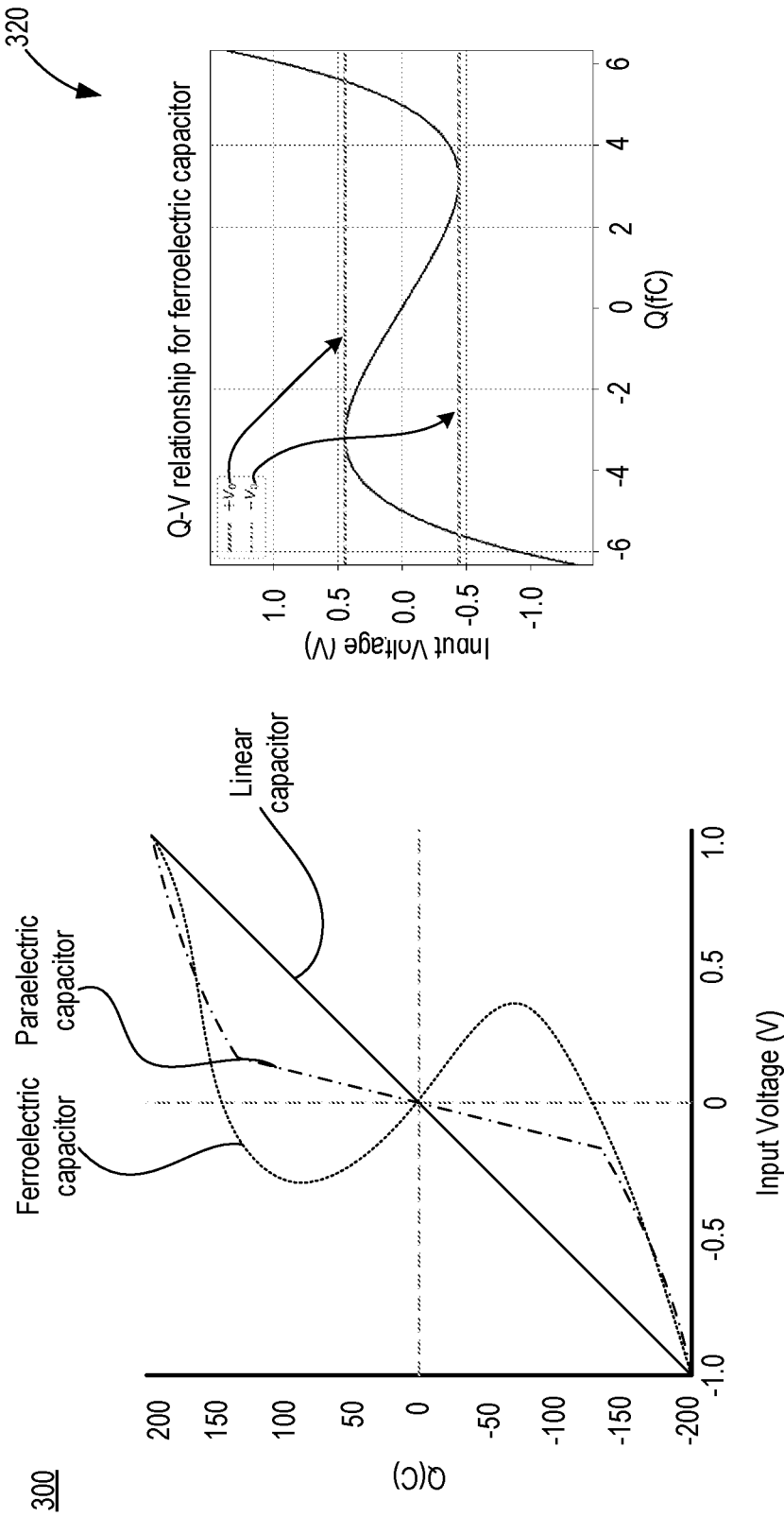
FIG. 3 illustrates a plot showing charge transfer function for non-linear capacitors compared to a linear capacitor.

FIG. 3 illustrates a set of plots showing charge transfer function for non-linear capacitors compared to a linear capacitor. Plot 300 compares the transfer function for a linear capacitor, a paraelectric capacitor (a non-linear capacitor) and a ferroelectric capacitor (a non-linear capacitor). Here, x-axis is input voltage or voltage across the capacitor, while the y-axis is the charge on the capacitor. Plot 320 shows the charge and voltage relationship for a ferroelectric capacitor. A capacitor with ferroelectric material (also referred to as an FEC) is a non-linear capacitor with its potential $V_F(Q_F)$ as a cubic function of its charge. Plot 320 illustrates characteristics of an FEC. Plot 320 is a charge-voltage (Q-V) plot for a block of $Pb(Zr_{0.5}Ti_{0.5})O_3$ of area $(100\ nm)^2$ and thickness 20 nm (nanometer). Plot 320 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 4:
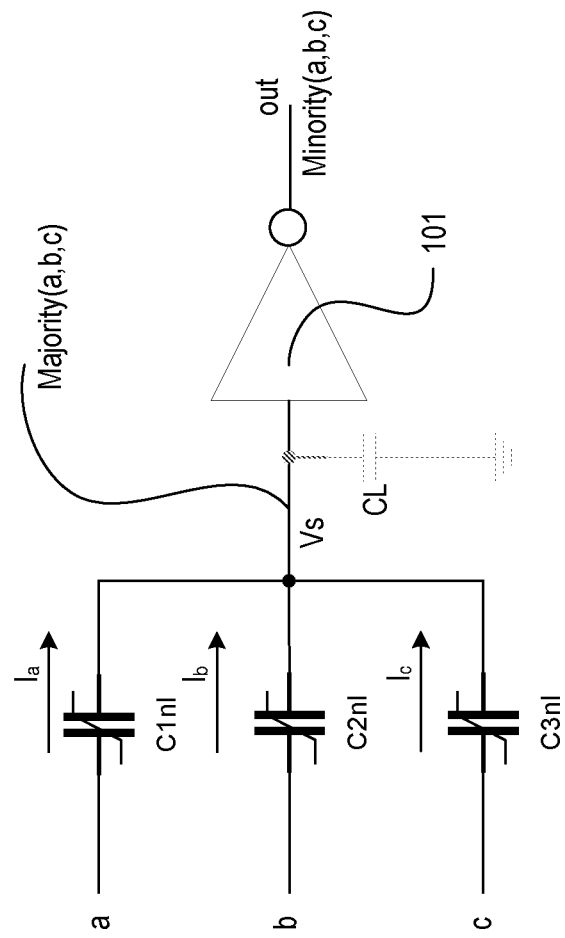
FIG. 4 illustrates a 3-input majority gate using non-linear input capacitors, in accordance with some embodiments.

FIG. 4 illustrates 3-input majority gate 400 using non-linear input capacitors, in accordance with some embodiments. In some embodiments, 3-input majority gate 400 comprises non-linear input capacitors C1nl, C2nl, and C3nl that receive digital signals a, b, and c, respectively. Here, signal names and node names are interchangeably used. For example, 'a' refers to node 'a' or signal 'a' depending on the context of the sentence. One end or terminal of capacitor C1nl is coupled to node a while the other end of capacitor C1nl is coupled to summing node Vs. The same is true for other non-linear capacitors C2nl and C3nl as shown. In some embodiments, 3-input majority gate 400 comprises a driver circuitry 101. In this example, driver circuitry 101 is an inverter. In other embodiments, other types of driver circuitries can be used such as NAND gate, NOR gate, multiplexer, buffer, and other logic gates. The majority function is performed at summing node Vs as Majority(a,b,c). In this example, since driver 101 is an inverter, minority function is performed at output "out" as Minority(a,b,c).

In some embodiments, in addition to the gate capacitance of driver circuitry 101, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, paraelectric capacitor, or non-linear dielectric capacitor. A dielectric capacitor comprises first and second metal plates with a dielectric between them. Examples of such dielectrics are: HfO, ABO3 perovskites, nitrides, oxy-fluorides, oxides, etc. A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C1nl, C2nl, and C3nl comprise non-linear polar material. In some embodiments, the non-linear polar material includes one of: ferroelectric (FE) material, paraelectric material, relaxor ferroelectric, or non-linear dielectric. In various embodiments, paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as paraelectric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, and PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type ABO3, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site, La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of: BaTiO3, PbTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material includes lead zirconium titanate (PZT), or PZT with a doping material, wherein the doping material is one of La or Nb. In some embodiments, the FE material includes a relaxor ferroelectric including one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1−x Ex Oy, where E can be Al, Ca, Ce, Dy, Er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related *Aurivillius* phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides, such as Al-doped ZnO. Examples of spinels include Fe3O4 and LiV2O4. Examples of cubic metals include Indium Tin Oxide (ITO), such as Sn-doped In2O3.

The majority function is performed at the summing node Vs, and the resulting voltage is projected on to capacitance of driver circuitry 101. For example, the majority function of the currents ($I_a$, $I_b$, and $I_c$) on node Vs results in a resultant current that charges the FE capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 400. Any suitable driver 101 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 4 illustrates a 3-input majority gate, the same concept can be extended to more than 3 inputs to make an N-input majority gate, where N is greater than 2. In various embodiments, 'N' is an odd number. For example, a 5-input majority gate is similar to an input majority gate 400 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that although the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 101 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1, x_2, \ldots x_n) = V_{C_1, C_2, \ldots C_n} f(x_1, x_2, \ldots x_n) \Delta x_1^{C_1} \Delta x_2^{C_2} \Delta x_3^{C_3} \ldots \Delta x_n^{C_n} \quad (1)$$

where $C_i$ is either 0 or 1. When $C_i$ is 1, $x_i^{C_i} = x_i$ (the input is used in its original form). When $C_1$ is 0, $x_i^{C_i} = \overline{x}_i$ (the input is used in its inverted form). The first level of logic is represented by at most $2^n$ AND gates (Δ), one for each of the $2^n$ possible combinations of 0 and 1 for $C_1, C_2, \ldots, C_n$. The second level of logic is represented by a single OR gate (∨). Each operand of the OR gate is a representation of a row in the truth table for $f(x_i, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 5:
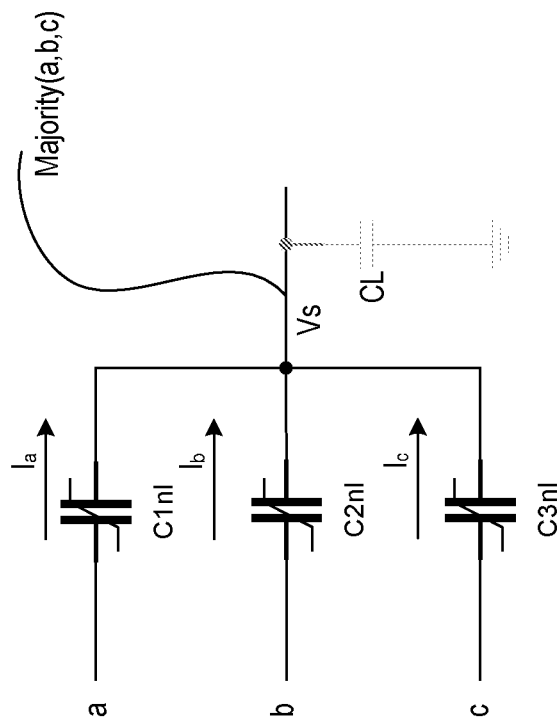
FIG. 5 illustrates a 3-input majority gate using non-linear input capacitors and no driver circuitry, in accordance with some embodiments.

FIG. 5 illustrates 3-input majority gate 500 using non-linear input capacitors and no driver circuitry, in accordance with some embodiments. In some embodiments, the summing node Vs is not coupled to a CMOS driver (e.g., buffer, inverter, NAND gate, or any other CMOS logic gate). In one example, Vs is coupled to another majority or minority gate. For instance, Vs is coupled to a terminal of another non-linear capacitor of another majority or minority gate.

Figure 6:
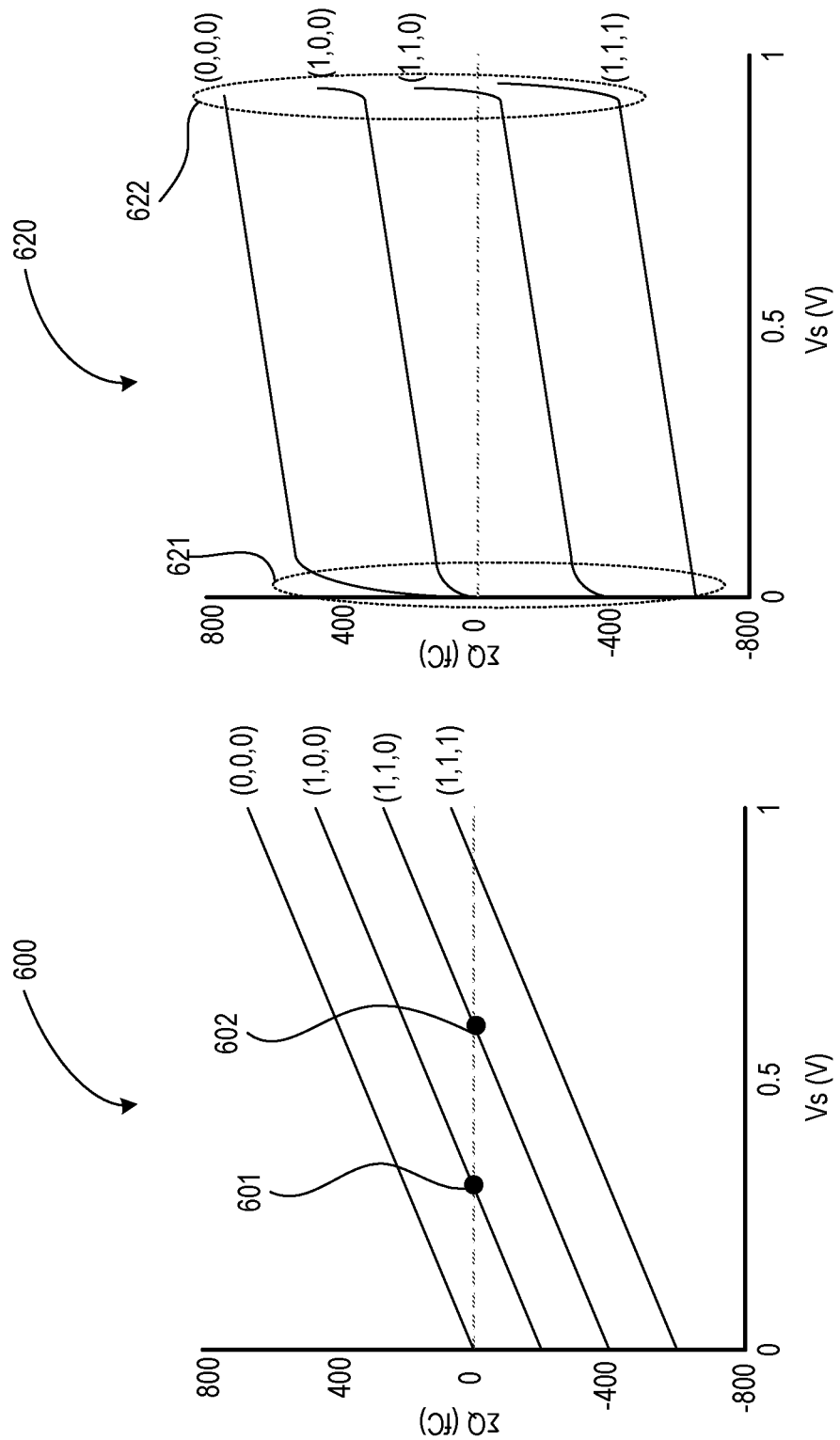
FIG. 6 illustrates a set of plots showing logic state separation for non-linear capacitors compared to a linear capacitor, in accordance with some embodiments.

FIG. 6 illustrates a set of plots 600 and 620 showing logic state separation for non-linear capacitors compared to a linear capacitor, in accordance with some embodiments. The sum of all charges must be zero to determine Vs for given sets of inputs $V_a$, $V_b$, and $V_c$ (which are voltages on nodes a, b, and c, respectively) as follows:

$$\Sigma Q(V_s) = Q_a(V_a - V_s) + Q_b(V_b - V_s) + Q_c(V_c - V_s) - C_L V_s = 0 \quad (2)$$

Plot 600 shows sum of charges for different values of $V_a$, $V_b$, and $V_c$ when the input capacitors are linear capacitors as in FIG. 1. Plot 620 shows sum of charges for different values of $V_a$, $V_b$, and $V_c$ when the input capacitors are non-linear capacitors as in FIG. 4. The different values are: $V_a=0$, $V_b=0$, and $V_c=0$; $V_a=1$, $V_b=0$, and $V_c=1$; $V_a=1$, $V_b=0$, and $V_c=0$; and $V_a=1$, $V_b=1$, and $V_c=1$.

Plot 600 shows two points 601 and 602 for inputs (1,0,0) for ($V_a$, $V_b$, and $V_c$) and (1,1,0) which do not provide a clear logic level of 0 or 1. Inputs (1,0,0) for ($V_a$, $V_b$, and $V_c$) are expected to generate a 0 on node n1, but results in a higher voltage closer to 0.3, which is too close to a threshold voltage of transistor of driver circuitry 101. Inputs (1,1,0) for ($V_a$, $V_b$, and $V_c$) are expected to generate a 1 on node n1, but results in a lower voltage closer to 0.7. Such voltages on node n1 result in crowbar current through driver circuitry 101. Plot 620 shows the desired majority gate solution where all input combinations result in clear voltage levels of 0 (e.g., 621) or 1 (622).

Figure 7A:
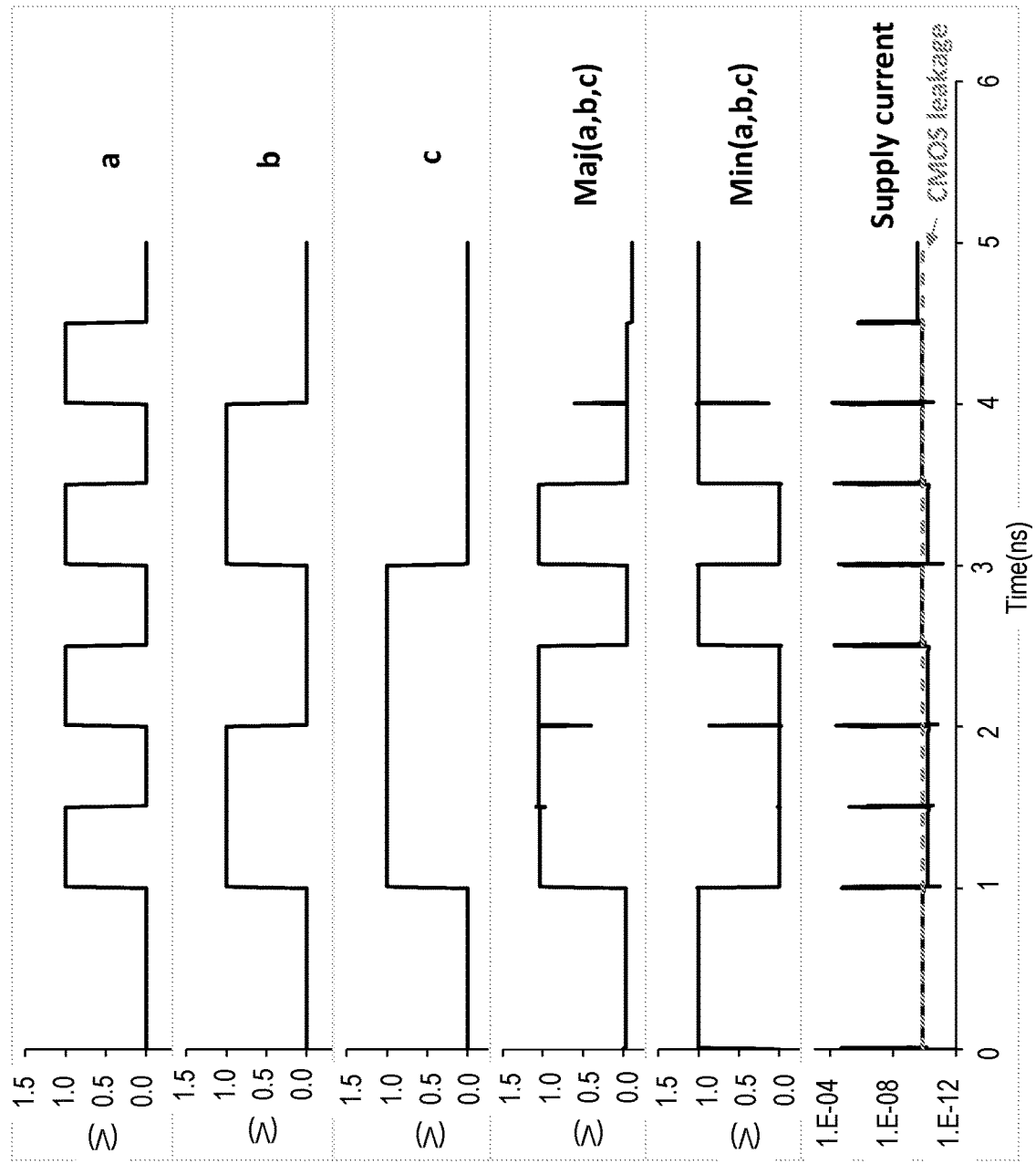
FIG. 7A illustrates a timing diagram for a 3-input majority or minority gate using ferroelectric input capacitors, in accordance with some embodiments.
Figure 7B:
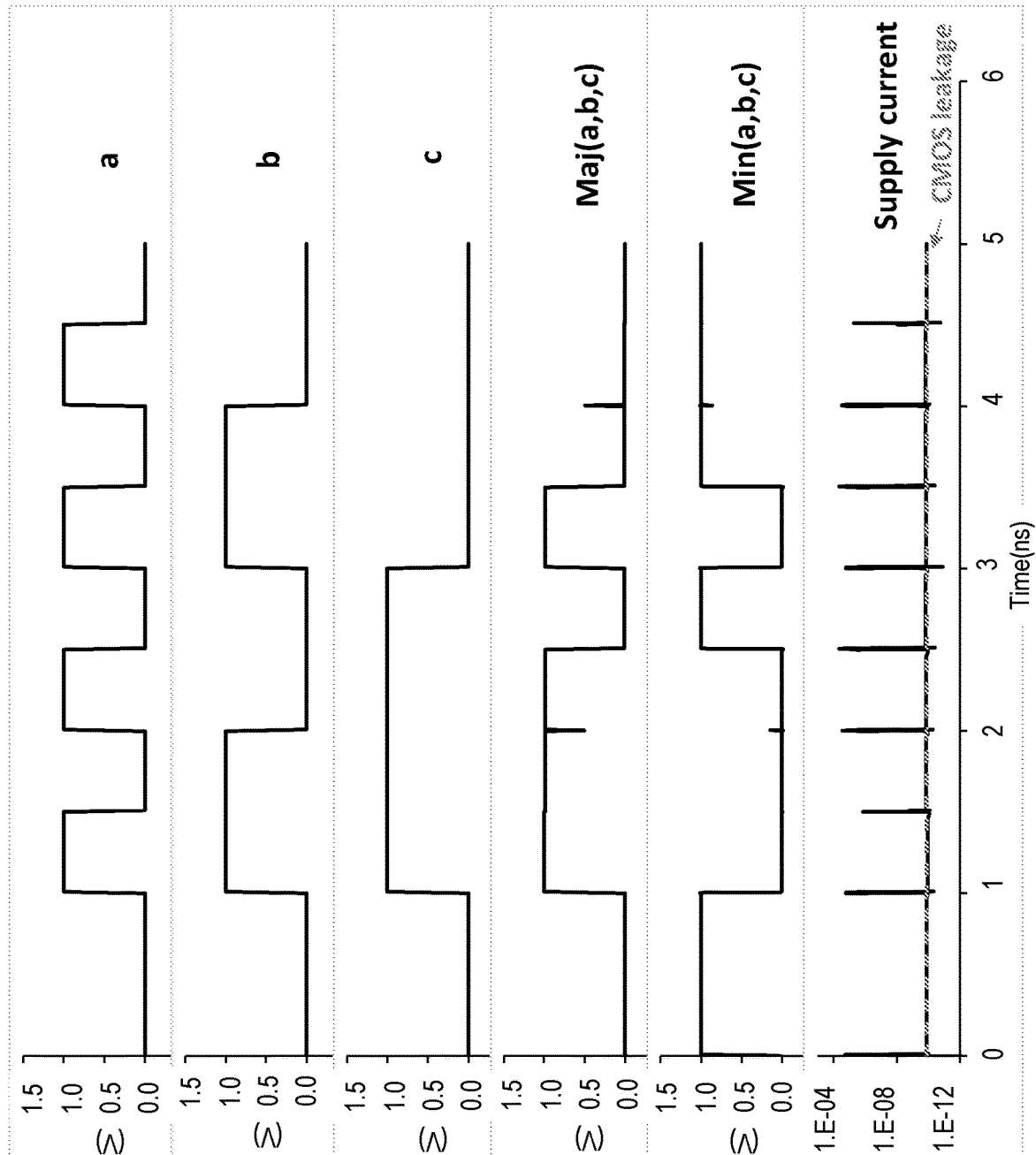
FIG. 7B illustrates a timing diagram from a 3-input majority gate or minority gate using paraelectric input capacitors, in accordance with some embodiments.

FIG. 7A illustrates timing diagram 700 for a 3-input majority or minority gate using ferroelectric input capacitors, in accordance with some embodiments. FIG. 7B illustrates timing diagram 720 from a 3-input majority gate or minority gate using paraelectric input capacitors, in accordance with some embodiments. In both cases, the voltage on node Vs shows a rail-to-rail voltage for majority function. Such rail-to-rail voltage suppresses crowbar current through driver circuitry 101. For some input combinations, using ferroelectric material can suppress leakage current below CMOS leakage level compared to using paraelectric material for the input capacitors.

Figure 8:
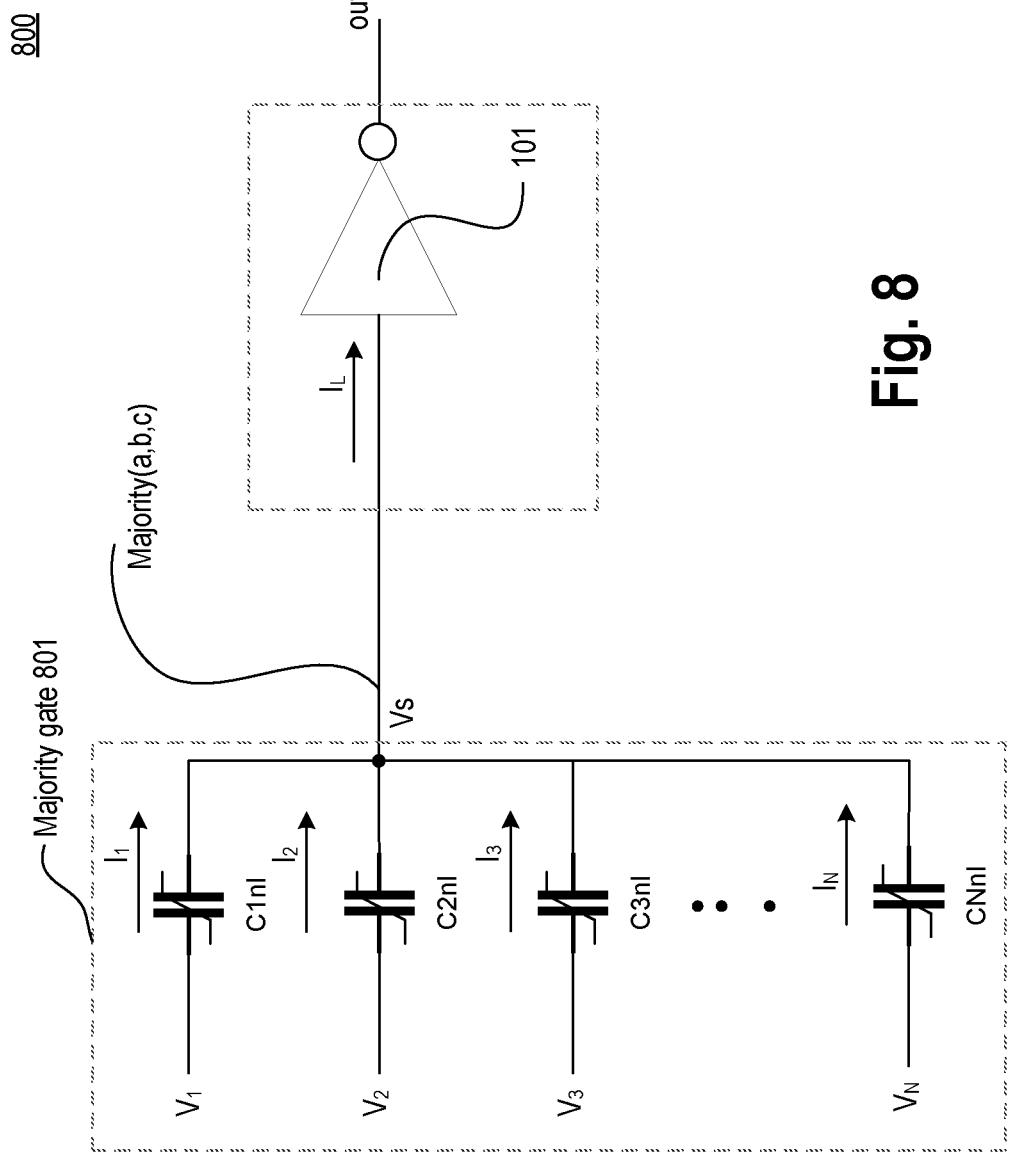
FIG. 8 illustrates a majority gate with N-input non-linear capacitors and corresponding N-inputs, respectively, wherein the N-input non-linear capacitors are leaky capacitors, in accordance with some embodiments.

FIG. 8 illustrates logic gate 800 comprising majority gate 801 with N-input non-linear capacitors C1nl through CNnl and corresponding N-inputs $V_1$ through $V_N$, respectively, wherein the N-input non-linear capacitors are leaky capacitors, in accordance with some embodiments. First terminal of an individual capacitor is connected to an input while the second terminal of an individual capacitor is connected to a common node, Vs. Vs is also referred to as the majority node or the summing node. In this example, the summing node Vs is connected to an input of driver circuitry 101, which generates the output "out". In some embodiments, the non-linear capacitors C1nl though CNnl are leaky capacitors.

Here the term "leaky capacitors" generally refers to non-linear capacitors that leak away charge from the summing node Vs such that no reset transistors are needed on the summing node while maintaining the majority function of the inputs $V_1$ through $V_N$ on the summing node. The leakage through the capacitors is configured such that the non-linear capacitors C1nl though CNnl of majority gate 801 have substantially equal leakage, and this leakage has an I-V (current-voltage) behavior which is symmetric. As such, reset device(s) on the summing node Vs are not used, in accordance with various embodiments. Reset devices are typically used to reset the charge on the summing node and the input of the capacitors so that they operate properly as new inputs signals arrive on the first terminals o the capacitors. Here, such reset transistors may not be used. The leakage through the non-linear capacitors C1nl though CNnl maintains the majority functionality even for long periods of inactivity. In some examples, the capacitor leakage may maintain the majority functionality permanently, and not for just long periods of time. In various embodiments, the leakage through capacitors C1nl through CNnl (herein also referred to as the leaky capacitors) of the majority gate causes the majority gate functionality to change from capacitive majority function to resistive majority function. The capacitor leakage creates a resistive majority (herein referred to as R-MAJ) that dominates under steady state and guarantees the majority gate functionality, so no resets are needed. The non-linear capacitances create a capacitive majority (herein referred to as C-MAJ) that dominates under high activity.

In various embodiments, the leakage through the non-linear capacitors C1nl though CNnl of majority gate 801 causes the majority gate functionality to change from capacitive majority function to resistive majority function. The capacitor leakage creates a resistive majority (herein referred to as R-MAJ) that dominates under steady state and guarantees the majority gate functionality, so no resets are needed. The non-linear capacitances create a capacitive majority (herein referred to as C-MAJ) that dominates under high activity. In various embodiments, under worst case steady-state conditions (e.g., some inputs set to high and some set to low), low margins may develop but the majority function of the gate is maintained by the leaky capacitors. Inverters (e.g., inverter 101) switch when the input moves across the Vdd/2 voltage level. If the input is less than Vdd/2 the output goes high, and if the input is higher than Vdd/2 the output goes low. The majority gate has to produce a summing node voltage higher or lower than Vdd/2 with enough margin. The higher the margin the better. If margins are low (e.g., few mV above or below Vdd/2), high leakage from supply to ground develops across inverter 101. Also, low margins may produce loss of functionality due to threshold voltage variations. In various embodiments, the non-linear capacitors C1nl though CNnl of majority gate 801 are specified to have leakage current (under room temperature or operating temperature) to be high enough to maintain the majority function on the summation node. The worst-case leakage of the capacitors is desired to be limited to a reasonable factor over the leakage $I_L$ of CMOS circuit 101 which is connected to the summation node.

Figure 9:
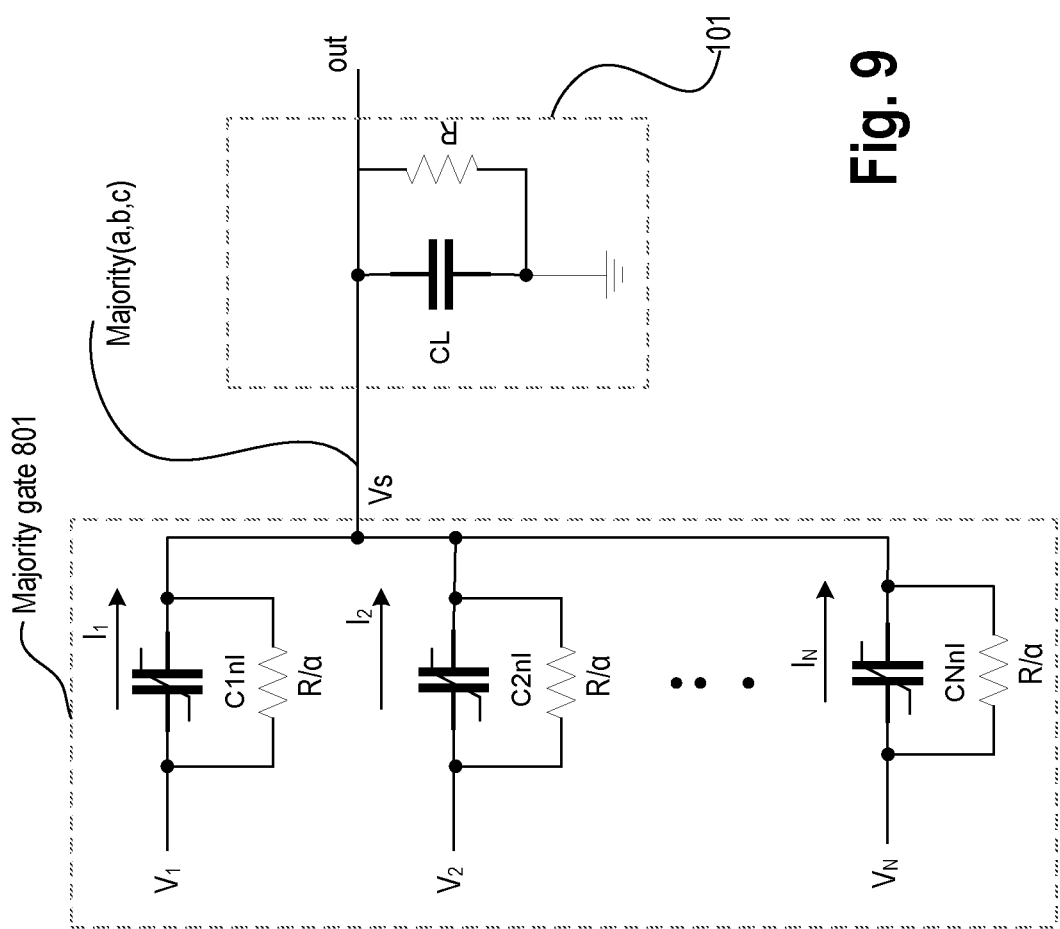
FIG. 9 illustrates a majority gate wherein capacitance leakage of the N-input non-linear capacitors is approximated by linear resistors, in accordance with some embodiments.

FIG. 9 illustrates logic gate 900 having majority gate 801 wherein capacitance leakage of the N-input non-linear capacitors C1nl though CNnl is approximated by linear resistors with resistance R/α, in accordance with some embodiments. Here, the a factor determines leakage through the non-linear capacitor relative to leakage through driver circuitry 101 (herein the load). From current neutrality, the following is derived:

$$Vs = \frac{1}{N + 1/\alpha} \sum_{i=1}^{N} V_i \tag{3}$$

Where Vs is the voltage on the summing node Vs, $V_i$ is the input voltage to a first terminal of a capacitor, and N is the total number of inputs (same as total number of capacitors). In various embodiments, the majority function of the inputs $V_1$ through $V_N$ on summing node Vs is satisfied if:

Vs<½ when most inputs are 0
Vs>½ when most inputs are 1

In various embodiments, majority gate conditions are satisfied with α>1. If α is too high, the leakage through the non-linear capacitors C1nl though CNnl may become much higher than leakage through the load. The worst-case condition for leakage through non-linear capacitors C1nl though CNnl is when (N+1)/2 inputs are high, making the logic voltage level on summing node Vs high, and the remaining (N−1)/2 capacitors leak to ground. In that case, the ratio of capacitance leakage to load leakage is α(N−1)/2. In some embodiments, this ratio of α(N−1)/2 is forced to no more than a chosen factor β, resulting in α<2β/(N−1). In various embodiments, for logic gate 900 to operate without reset transistors, a suitable range for α is:

$$1 < \alpha < \frac{2\beta}{N - 1} \tag{4}$$

Figure 10:
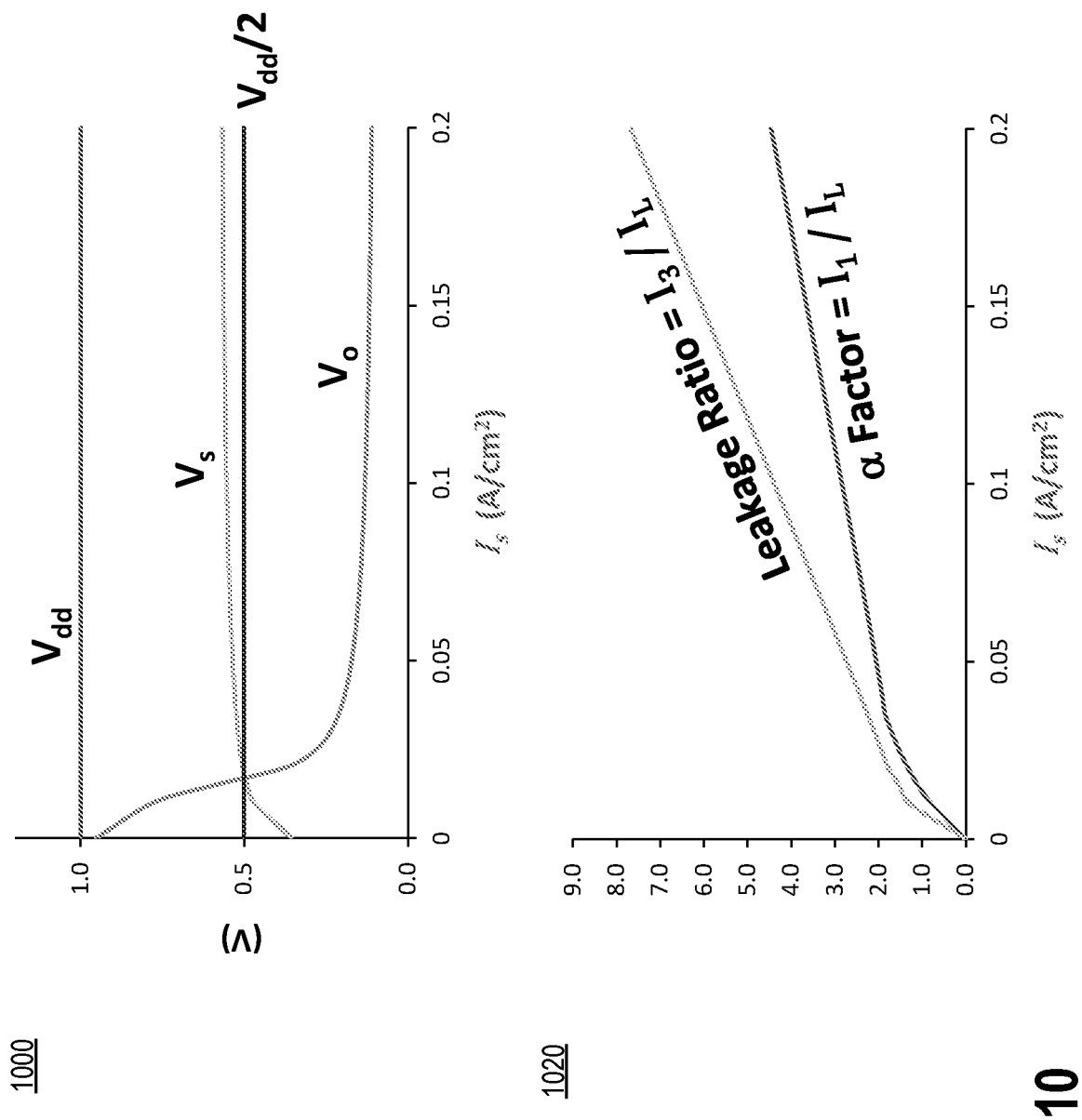
FIG. 10 illustrates a set of plots of a model showing functionality of a 3-input majority gate with leaky capacitors, in accordance with some embodiments.

FIG. 10 illustrates a set of plots 1000 and 1020 of a model showing functionality of a 3-input majority gate with leaky capacitors, in accordance with some embodiments. Leakage mechanisms in dielectrics have an exponential behavior. As such, the leakage through the non-linear capacitors can be modeled as back-to-back diodes with current expressed as:

$$I = AI_s \left( e^{\frac{qV_{in}}{nKT}} - e^{\frac{qV_{in}}{nKT}} \right) \quad (5)$$

Where A is the capacitor area, $I_s$ is the saturation current per unit area, $V_{in}$ is the voltage across the capacitor, n is an ideality factor, and kT/q is the thermal voltage. Plots 1000 and 1020 are described with reference to FIG. 11.

Figure 11:
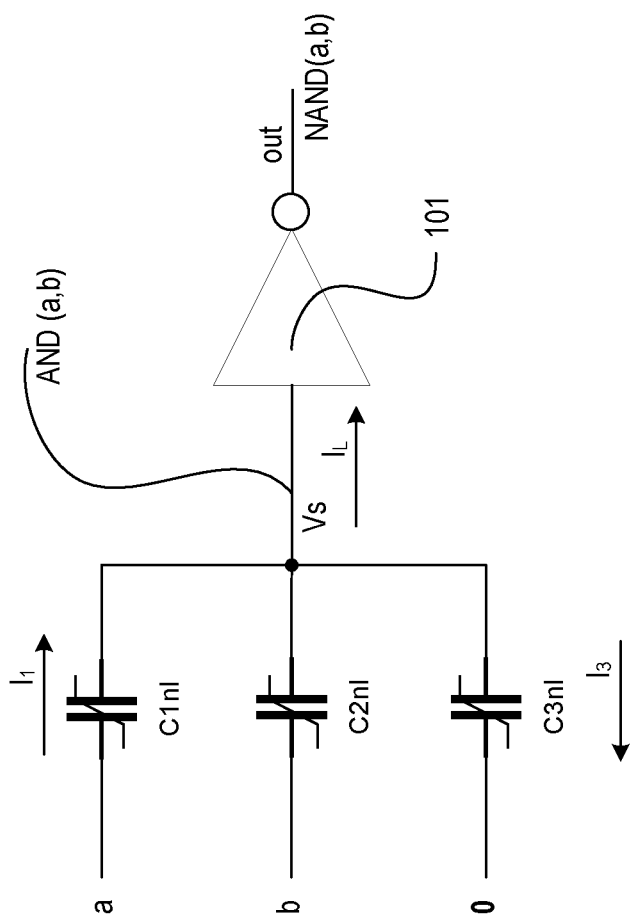
FIG. 11 illustrates a 3-input majority gate which is configured to operate as an OR/NOR gate, in accordance with some embodiments.

FIG. 11 illustrates logic gate 1100 having a 3-input majority gate which is configured to operate as an OR/NOR gate, in accordance with some embodiments. Logic gate 1100 is similar to logic gate 400, but for setting input 'c' to logic low (e.g., ground or Vss). Other inputs 'a' and 'b' are set to logic high to simulate the worst-case condition for maintaining majority function on summing node Vs. In this example, saturation current $I_s$ is swept from 0 to 0.2 A/cm². Referring to FIG. 10, plot 1000 shows that Vs>$V_{dd}$/2 for α>1 maintains the majority function on summing node Vs when logic gate 1100 is set for worst-case scenario (with reference to maintaining its majority function). Plot 1020 shows that selecting a capacitance leakage no greater than four times of the leakage of CMOS driver 101 (e.g., β=4) gives a saturation current $I_s$ of approximately 0.1 A/cm².

While the various embodiments here are described with reference to leaky capacitors, the complex logic gates described here can also be constructed using non-leaky (or substantially non-leaky) non-linear polar material (ferroelectric, paraelectric, non-linear dielectric) based capacitors.

Figures 12A, 12B:
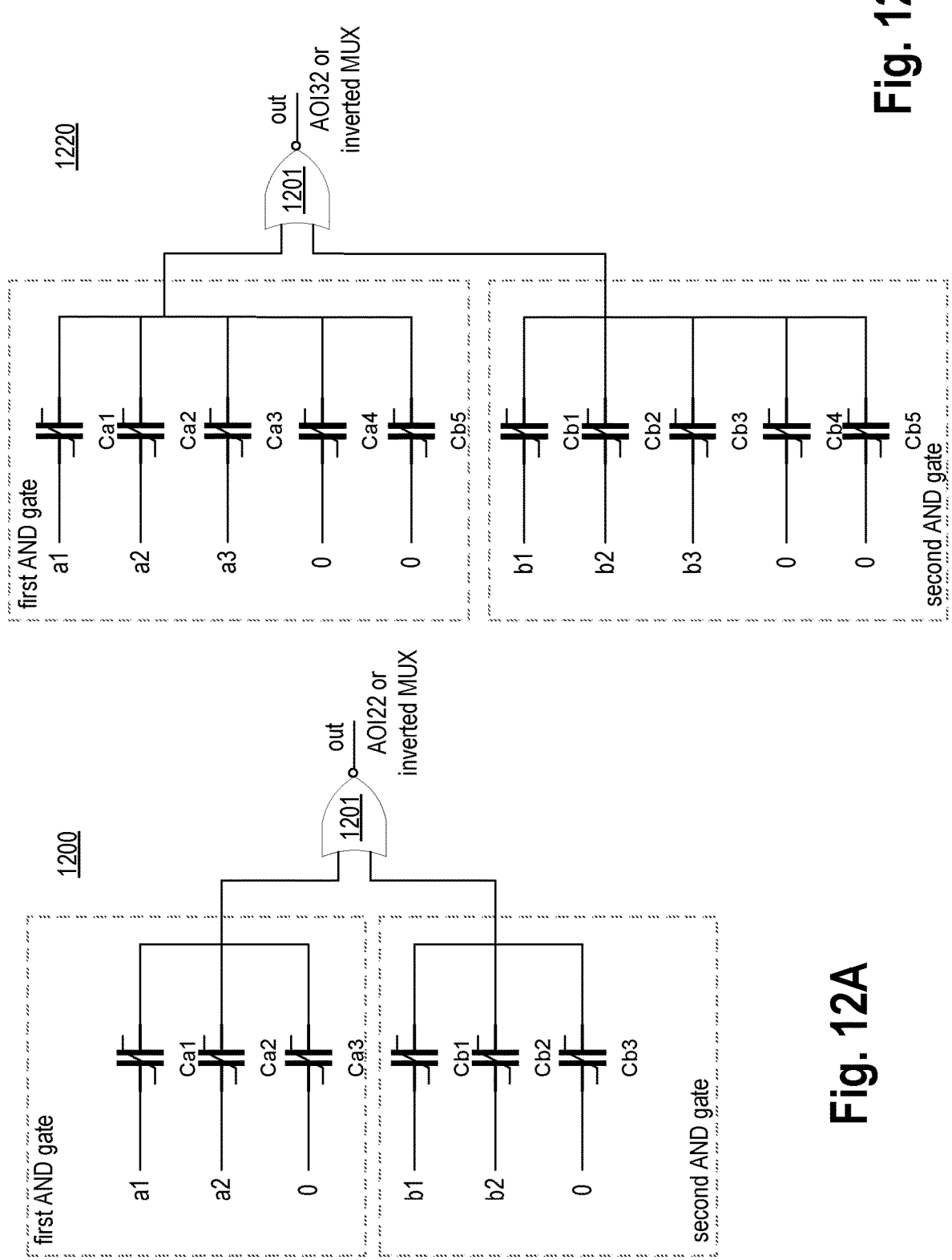
FIG. 12A illustrates a 4-input AND-OR-INVERT complex logic gate comprising two 2-input AND gates as majority gates and a CMOS NOR gate, in accordance with some embodiments.
FIG. 12B illustrates a 6-input AND-OR-INVERT complex logic gate comprising two 3-input AND gates as majority gates and a CMOS NOR gate, in accordance with some embodiments.

FIG. 12A illustrates a 4-input AND-OR-INVERT complex logic gate 1200 comprising two 2-input AND gates as majority gates and CMOS NOR gate 1201, in accordance with some embodiments. In some embodiments, a first AND gate is provided which comprises non-linear capacitors Ca1, Ca2, and Ca3. A first terminal of capacitor Ca1 receives input a1 while a second terminal of capacitor Ca1 is coupled to a first input of NOR gate 1201. A first terminal of capacitor Ca2 receives input a2 while a second terminal of capacitor Ca2 is coupled to the first input of NOR gate 1201. A first terminal of capacitor Ca3 receives input 0 (e.g., fixed input which is tied to a ground supply rail Vss) while a second terminal of capacitor Ca3 is coupled to the first input of NOR gate 1201. In various embodiments, inputs a1 and a2 are variable inputs of the 2-input AND gate. These inputs can be digital, analog, or a combination of them, in accordance with some embodiments.

In some embodiments, a second AND gate is provided which comprises non-linear capacitors Cb1, Cb2, and Cb3. A first terminal of capacitor Cb1 receives input b1 while a second terminal of capacitor Cb1 is coupled to the first input of NOR gate 1201. A first terminal of capacitor Cb2 receives input b2 while a second terminal of capacitor Cb2 is coupled to the first input of NOR gate 1201. A first terminal of capacitor Cb3 receives input 0 (e.g., fixed input which is tied to a ground supply rail Vss) while a second terminal of capacitor Cb3 is coupled to the first input of NOR gate 1201. In various embodiments, inputs b1 and b2 are variable inputs of the 2-input AND gate. The output of NOR gate 1201 is "out" which indicates a complex function of AND-OR-INVERT-2-2. Here, AND-OR-INVERT-2-2 refers a function with a first AND operation of two inputs a1 and a2 using a first majority gate, a second AND operation of two inputs b1 and b2 using a second majority gate, and 2-input NOR operation on the outputs of the first majority gate and the second majority gate.

The output "out" may also indicate a multiplexer (MUX) function, in accordance with some embodiments. In some embodiments, a select input signal is used to select between the two other inputs. For example, b2 signal could be complement of a2. In this scenario, AO122 cell 1200 would work as an inverted MUX to output either a complement of a1 or b1 depending upon the value of a2 signal. For example, if a2 is 1 (in this case b2 would be zero), and the first AND gate gives a1 output and the second AND gate gives 0 output, NOR gate 1201 produces an inversion of the a2 signal.

FIG. 12B illustrates a 6-input AND-OR-INVERT complex logic gate 1220 comprising two 3-input AND gates as majority gates and a CMOS NOR gate, in accordance with some embodiments. Logic gate 1220 is like logic gate 1200 but with a larger first AND majority gate and a second AND majority gate. Compared to logic gate 1200, here the first AND gate includes an additional input a3, capacitor Ca3, capacitor Ca4, and capacitor Ca5. A first terminal of capacitor Ca3 is coupled to input a3 while the second terminal of capacitor Ca3 is coupled to NOR gate 1201. A fixed input of logic 0 (e.g., input tied to a ground supply rail) is connected to first terminals of capacitors Ca4 and Ca5 while second terminals of capacitors Ca4 and Ca5 are connected to the first terminal of NOR gate 1201. Here, the second AND gate includes an additional input b3, capacitor Cb3, capacitor Cb4, and capacitor Cb5 as shown. A first terminal of capacitor Cb3 is coupled to input b3 while the second terminal of capacitor Cb3 is coupled to a second terminal of NOR gate 1201. A fixed input of logic 0 (e.g., input tied to a ground supply rail) is connected to first terminals of capacitors Cb4 and Cb5 while second terminals of capacitors Cb4 and Cb5 are connected to the second terminal of NOR gate 1201.

The output of NOR gate 1201 of logic gate 1220 is "out" which indicates a complex function of AND-OR-INVERT-3-2. Here, AND-OR-INVERT-3-2 refers to a function with a first AND operation of three inputs a1, a2, and a3 using a first majority gate, a second AND operation of three inputs b1, b2, and b3 using a second majority gate, and a 2-input NOR operation on the outputs of the first majority gate and the second majority gate. These inputs can be digital, analog, or a combination of them, in accordance with some embodiments.

Figure 12C:
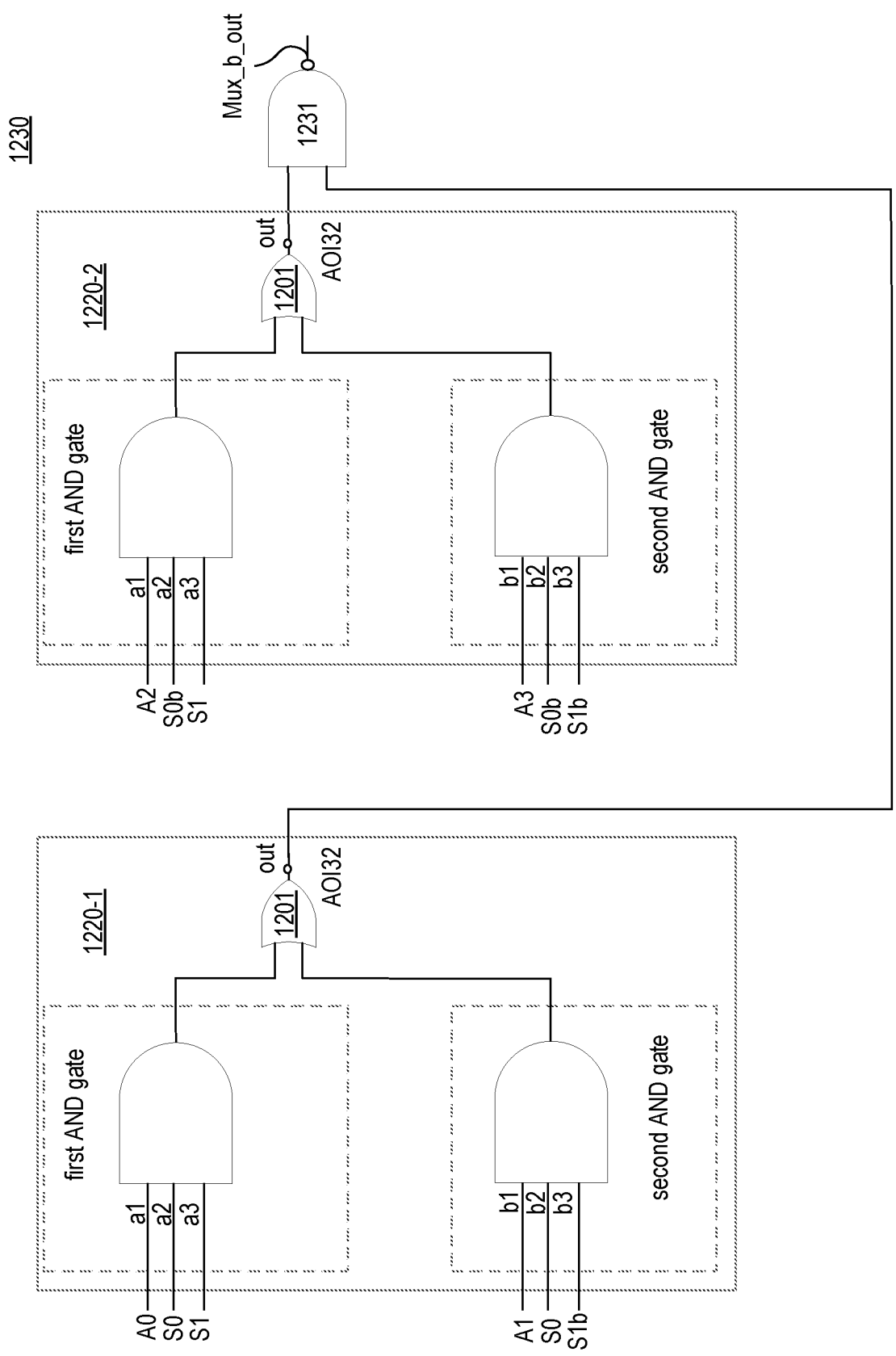
FIG. 12C illustrates a 4:1 MUX comprising two instances of AND-OR-INVERT-3-2 gates, in accordance with some embodiments.

FIG. 12C illustrates a 4:1 MUX 1230 comprising two instances of AND-OR-INVERT-3-2 gates, in accordance with some embodiments. In some embodiments, 4:1 MUX 1230 comprises AND-OR-INVERT-3-2 (AO132) gates (e.g., 1220-1 and 1220-2 gates) and 2-input NAND gate 1231. In some embodiments, the output Mux_b_out may indicate an inverted multiplexer (MUX) function. In some embodiments, NAND gate 1231 is a CMOS based NAND gate. In some embodiments, NAND gate 1231 comprises capacitors with non-linear polar material. In one such case, the NAND gate 1231 is like the AND gate of the AND-OR-INVERT-3-2 followed by an inverter with input connected to the summing node.

In various embodiments, multiplexer selection signals and their complement signals can be applied to inputs a2, a3, b2, and b3 to control the selection of the outputs. An individual AND gate receives a different set of select inputs to allow 4:1 MUX operation, where one input from among four inputs is selected as output Mux_b_out.

In some embodiments, input a1 of gate 1220-1 receives input AO while inputs a2 and a3 of first AND gate of gate 1220-1 receives select signals S0 and S1, respectively. For the same gate, input b1 of gate 1220-1 receives input A1 while inputs b2 and b3 of second AND gate of gate 1220-1 receives complementary select signals S0 and S1b, respectively.

Likewise, input a1 of gate 1220-2 receives input A2 while inputs a2 and a3 of first AND gate of gate 1220-2 receives select signals S0b and S1, respectively. For the same gate, input b1 of gate 1220-2 receives input A3 while inputs b2 and b3 of second AND gate of gate 1220-2 receives select signals S0b and S1b, respectively.

Note, select signals S0b and S1b are complementary to select signals S0 and S1, respectively. The output of each AO132 gate is an inverted signal of a1 or b1 depending on the logic values of the select signals, in accordance with some embodiments. As such, a 4:1 multiplexer is formed which has shorter delay than a comparable CMOS-only 4:1 digital multiplexer and smaller area. In one example, the delay and area improve by 1.5× compared to a 4:1 CMOS-only multiplexer.

Figure 12D:
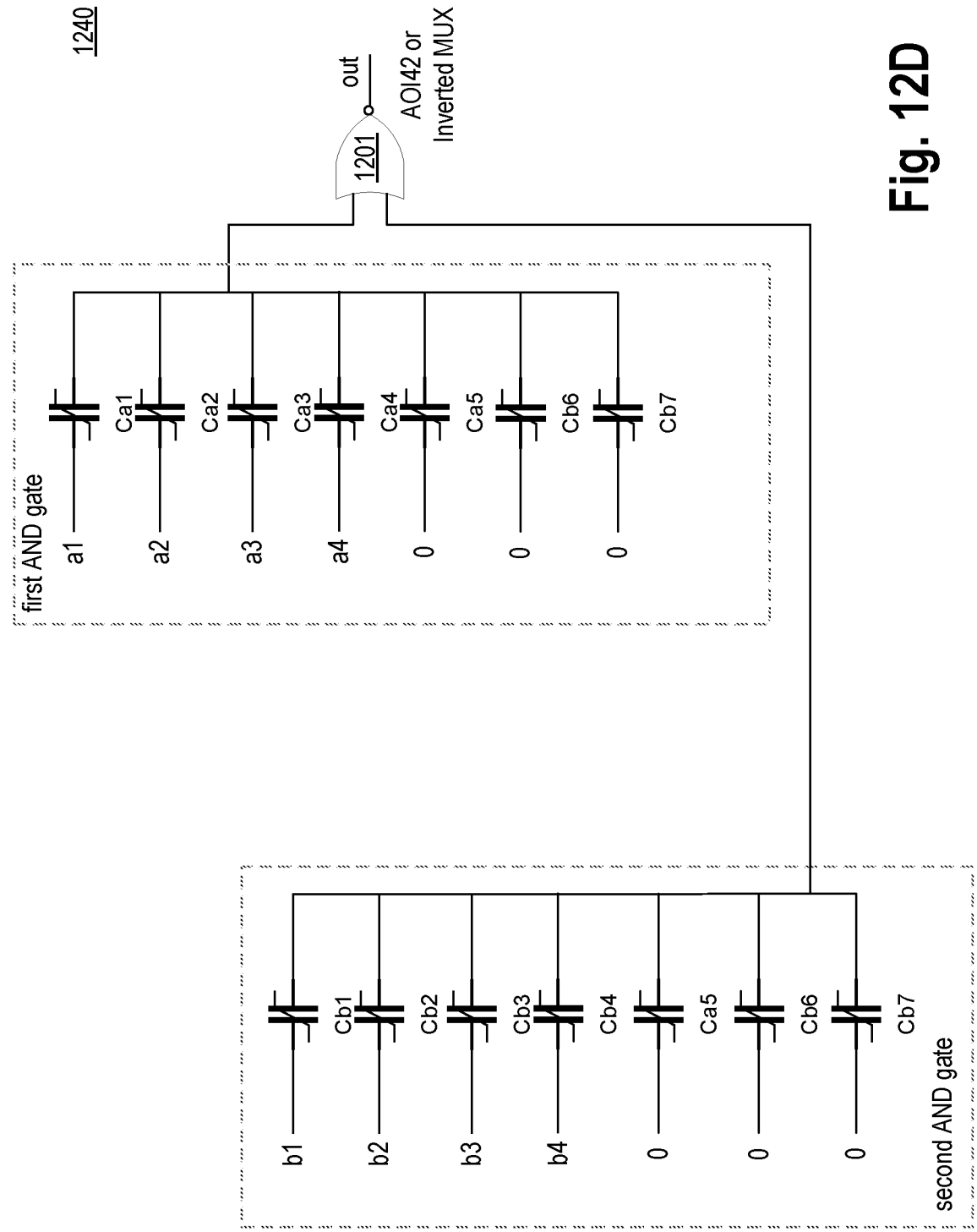
FIG. 12D illustrates an 8-input AND-OR-INVERT complex logic gate comprising two 4-input AND gates as majority gates and a CMOS NOR gate, in accordance with some embodiments.

FIG. 12D illustrates an 8-input AND-OR-INVERT complex logic gate 1240 comprising two 4-input AND gates as majority gates and a CMOS NOR gate, in accordance with some embodiments. Logic gate 1240 is like logic gate 1220 but with a larger first AND majority gate and second AND majority gate. Compared to logic gate 1220, here the first AND gate includes an additional input a4, capacitor Ca4, capacitor Ca5, capacitor Ca6, and capacitor Ca7 as shown. A first terminal of capacitor Ca4 is coupled to input a4 while the second terminal of capacitor Ca4 is coupled to NOR gate 1201. A fixed input of logic 0 (e.g., input tied to a ground supply rail) is connected to first terminals of capacitors Ca5, Ca6, and Ca7 while second terminals of capacitors Ca5, Ca6, and Ca7 are connected to the first terminal of NOR gate 1201. Here, the second AND gate includes an additional input b4 and capacitor Cb4 as shown. A first terminal of capacitor Cb4 is coupled to input b4 while the second terminal of capacitor Cb4 is coupled to a second terminal of NOR gate 1201. A fixed input of logic 0 (e.g., input tied to a ground supply rail) is connected to first terminals of capacitors Cb5, Cb6, and Cb7 while second terminals of capacitors Cb5, Cb6, and Cb7 are connected to the second terminal of NOR gate 1201.

The output of NOR gate 1201 of logic gate 1230 is "out" which indicates a complex function of AND-OR-INVERT-4-2. Here, AND-OR-INVERT-4-2 refers to a function with a first AND operation of four inputs a1, a2, a3, and a4 using a first majority gate, a second AND operation of four inputs b1, b2, b3, and b4 using a second majority gate, and a 2-input NOR operation on the outputs of the first majority gate and the second majority gate. These inputs can be digital, analog, or a combination of them, in accordance with some embodiments.

Figure 12E:
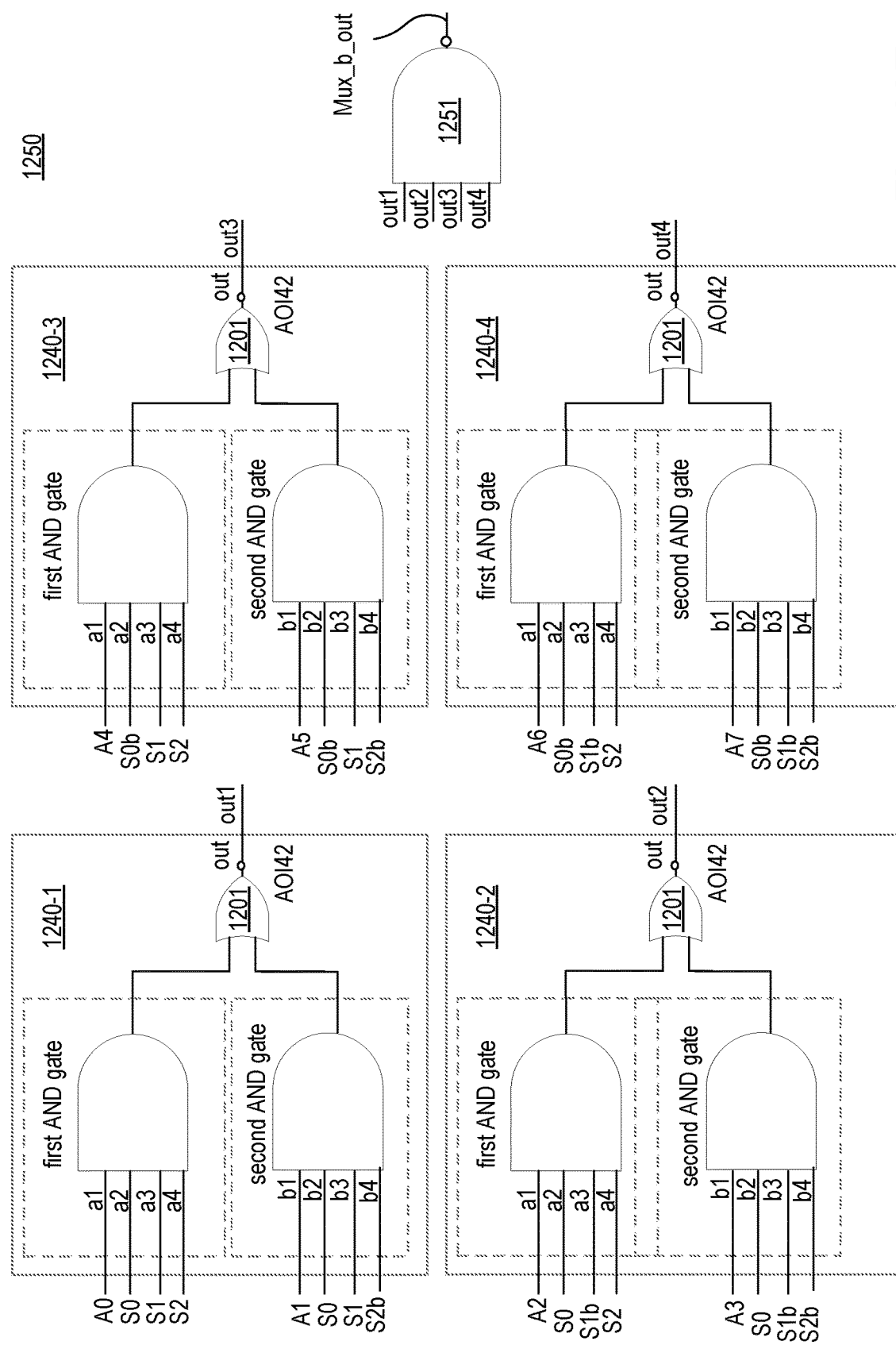
FIG. 12E illustrates an 8:1 MUX comprising four instance of AND-OR-INVERT-4-2 gates, in accordance with some embodiments.

FIG. 12E illustrates an 8:1 MUX 1250 comprising four instance of AND-OR-INVERT-4-2 gates 1240, in accordance with some embodiments. In some embodiments, 8:1 MUX 1240 comprises AND-OR-INVERT-4-2 (AO142) gates (e.g., 1240-1, 1240-2, 1240-3, and 1240-4 gates) and NAND gate 1251. In some embodiments, NAND gate 1251 is a CMOS based NAND gate. In some embodiments, NAND gate 1251 comprises capacitors with non-linear polar material. In one such case, the NAND gate 1251 is like the AND gate of the AND-OR-INVERT-4-2 followed by an inverter with input connected to the summing node. In some embodiments, the outputs ou1, ou2, ou3, and ou4 of gates 1240-1, 1240-2, 1240-3, and 1240-4 are input to 4-input NAND gate 1251. The output Mux_b_out of 4-input NAND gate 1241 is the inverted multiplexer output. In various embodiments, for each AO142 gate, inputs a2, a3, a4, b2, b3, b4 can be tied to select signals or their complements as shown. An individual AND gate receives a different set of select inputs to allow 8:1 MUX operation, where one input from among eight inputs is selected as output Mux_b_out. In various embodiments, 4-input NAND gate 1251 is also implemented as a majority gate using non-linear input capacitors. In one such example, the summing node Vs is coupled to an inverter which becomes the output of the majority gate based 4-input NAND gate 1251.

In various embodiments, multiplexer selection signals and their complement signals can be applied to inputs a2, a3, a4, b2, b3, and b4 such that each AND gate receive a different set of inputs. This allows the 8:1 multiplexer operation.

In some embodiments, input a1 of gate 1240-1 receives input AO while inputs a2, a3, and a4 of first AND gate of gate 1240-1 receives select signals S0, S1, and S2 respectively. For the same gate, input b1 of gate 1240-1 receives input A1 while inputs b2, b3, and b4 of second AND gate of gate 1240-1 receives select signals S1, S1, and S2b, respectively. Note, select signals S0b, S1b, and S2b are complementary to select signals S0, S1, and S2, respectively.

In some embodiments, input a1 of gate 1240-2 receives input A2 while inputs a2, a3, and a4 of first AND gate of gate 1240-2 receives select signals S1, S1b, and S2, respectively. For the same gate, input b1 of gate 1240-2 receives input A3 while inputs b2, b3, and b4 of second AND gate of gate 1240-2 receives select signals S0, S1b, and S2b, respectively.

In some embodiments, input a1 of gate 1240-3 receives input A4 while inputs a2, a3, and a4 of first AND gate of gate 1240-3 receives select signals S0b, S1, and S2, respectively. For the same gate, input b1 of gate 1240-3 receives input A5 while inputs b2, b3, and b4 of second AND gate of gate 1240-3 receives select signals S0b, S1, and S2b, respectively.

In some embodiments, input a1 of gate 1240-4 receives input A6 while inputs a2, a3, and a4 of first AND gate of gate 1240-4 receives select signals S0b, S1b, and S2, respectively. For the same gate, input b1 of gate 1240-4 receives input A7 while inputs b2, b3, and b4 of second AND gate of gate 1240-4 receives select signals S0b, S1b, and S2b, respectively.

As such, an 8:1 multiplexer is formed which has shorter delay than a comparable CMOS-only 8:1 digital multiplexer and smaller area. In one example, the delay and area improve by 1.5× compared to an 8:1 CMOS multiplexer.

Figure 12F:
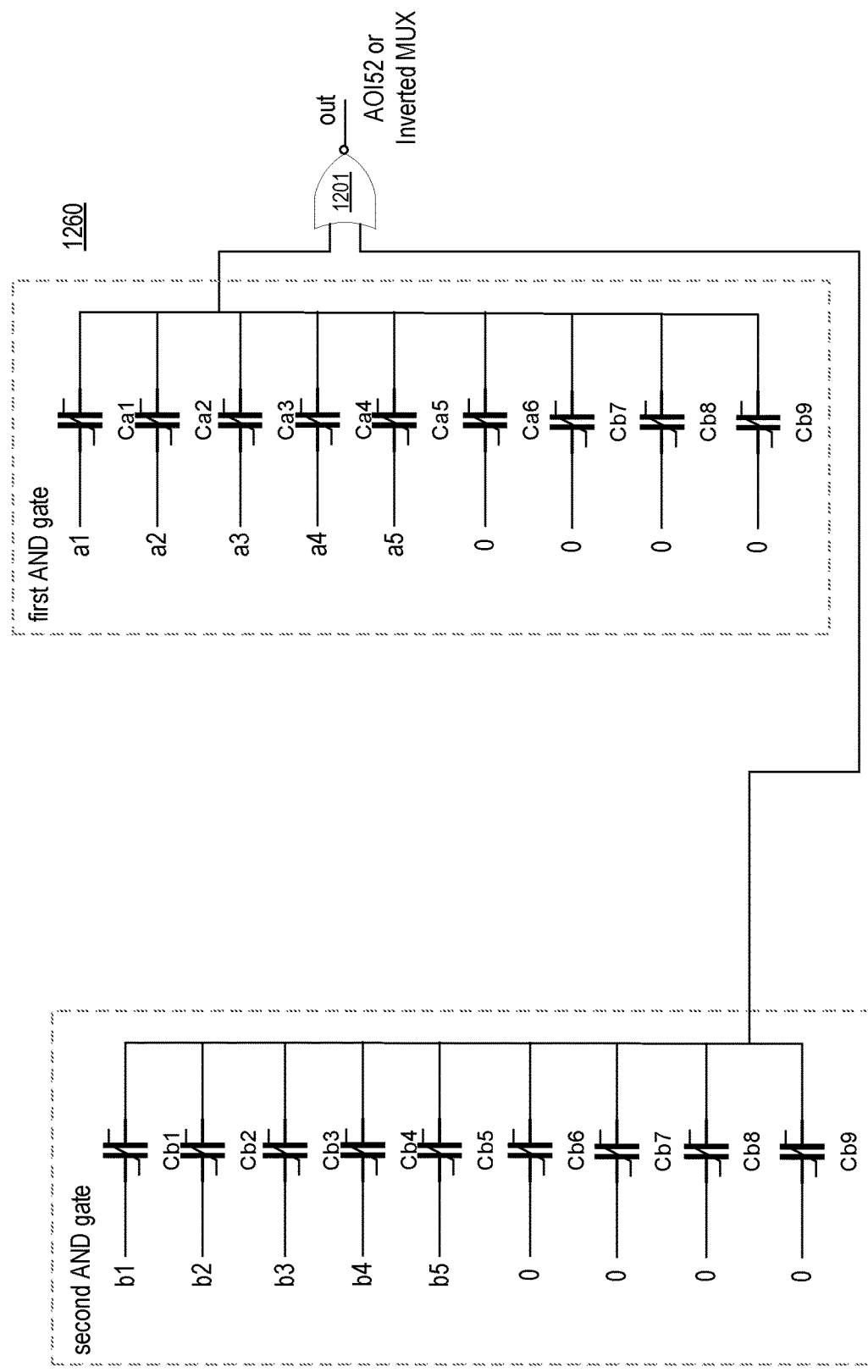
FIG. 12F illustrates a 10-input AND-OR-INVERT complex logic gate comprising two 5-input AND gates as majority gates and a CMOS NOR gate, in accordance with some embodiments.

FIG. 12F illustrates a 10-input AND-OR-INVERT complex logic gate 1260 comprising two 5-input AND gates as majority gates and a CMOS NOR gate, in accordance with some embodiments. Logic gate 1260 is like logic gate 1240 but with a larger first AND majority gate and second AND majority gate. Compared to logic gate 1240, here the first AND gate includes an additional input a5, capacitor Ca5, capacitor Ca6, capacitor Ca7, capacitor Ca8, and capacitor Ca9. A first terminal of capacitor Ca5 is coupled to input a5 while the second terminal of capacitor Ca5 is coupled to a first terminal of NOR gate 1201. A fixed input of logic 0 (e.g., input tied to a ground supply rail) is connected to first terminals of capacitors Ca6, Ca7, Ca8, and Ca9 while second terminal of capacitors Ca6, Ca7, Ca8, and Ca9 are connected to the first terminal of NOR gate 1201. Here, the second AND gate includes additional input b5, capacitor Cb5 capacitor Cb6, capacitor Cb7, capacitor Cb8, and capacitor Cb9. A first terminal of capacitor Cb5 is coupled to input b5 while the second terminal of capacitor Cb5 is coupled to a second terminal of NOR gate 1201. A fixed input of logic 0 (e.g., input tied to a ground supply rail) is connected to first terminals of capacitors Cb6, Cb7, Cb8, and Cb9 while second terminals of capacitors Cb6, Cb7, Cb8, and Cb9 is connected to the second terminal of NOR gate 1201.

The output of NOR gate 1201 of logic gate 1260 is "out" which indicates a complex function of AND-OR-INVERT-5-2. Here, AND-OR-INVERT-5-2 refers to a function with a first AND operation of four inputs a1, a2, a3, a4, and a5 using a first majority gate, a second AND operation of four inputs b1, b2, b3, b4, and b5 using a second majority gate, and a 2-input NOR operation on the outputs of the first majority gate and the second majority gate. These inputs can be digital, analog, or a combination of them, in accordance with some embodiments. Like other AOI gates discussed here, AND-OR-INVERT-5-2 can also be configured as a multi-input multiplexer using the same concepts as discussed with reference to FIG. 12C and FIG. 12E.

Figure 13B:
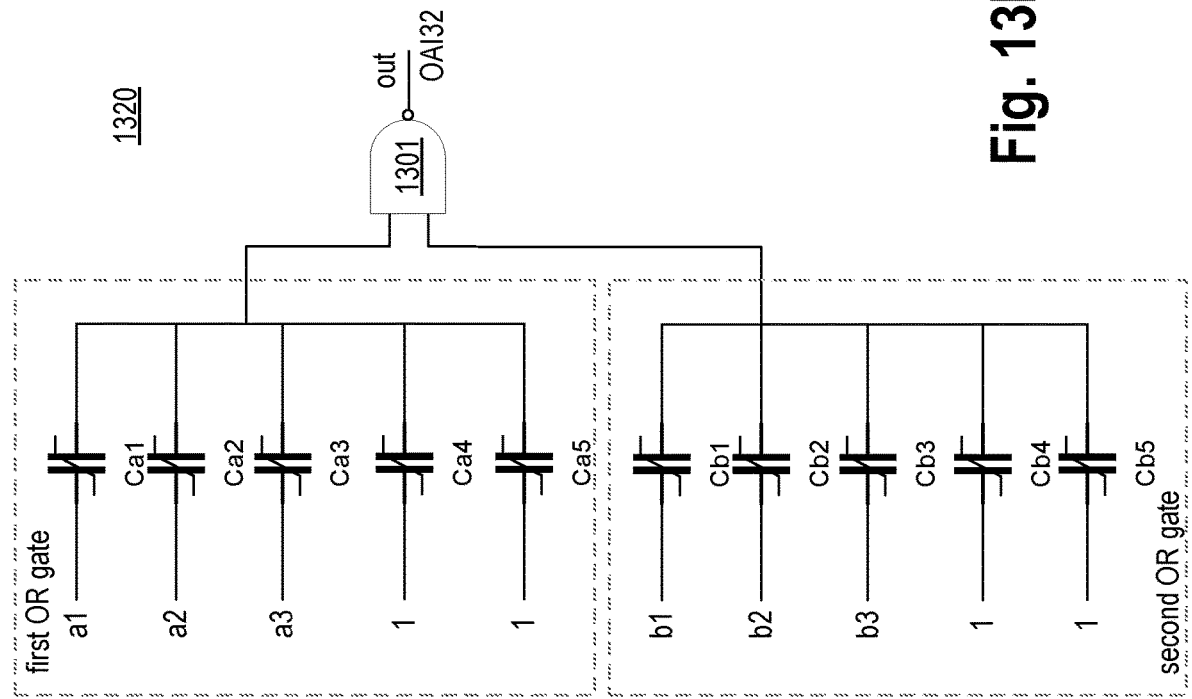
FIG. 13B illustrates a 6-input OR-AND-INVERT complex logic gate comprising two 3-input OR gates as majority gates and a CMOS AND gate, in accordance with some embodiments.
Figure 13A:
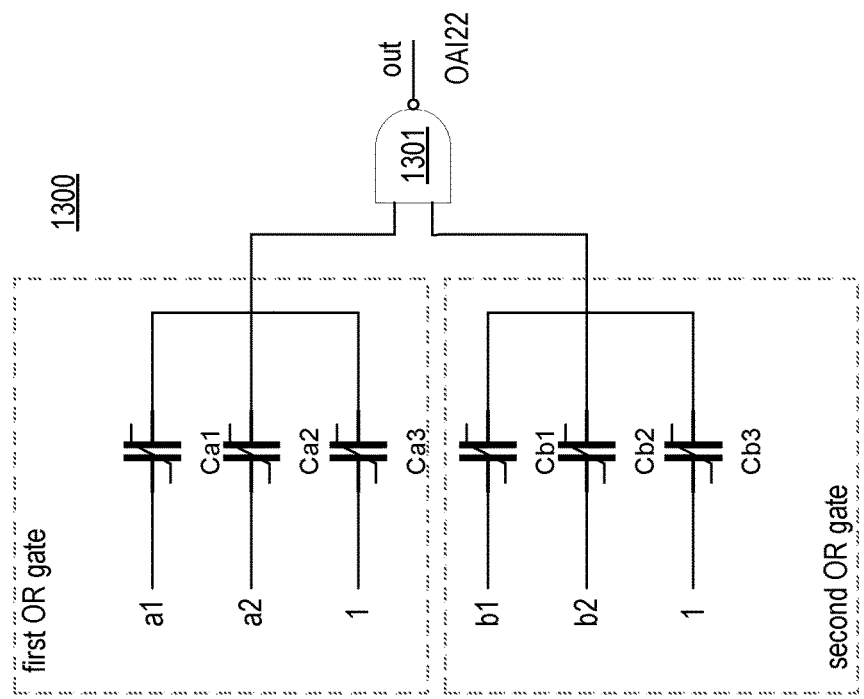
FIG. 13A illustrates a 4-input OR-AND-INVERT complex logic gate comprising two 2-input OR gates as majority gates and a CMOS NAND gate, in accordance with some embodiments.

FIG. 13A illustrates a 4-input OR-AND-INVERT complex logic gate 1300 comprising two 2-input OR gates as majority gates and a CMOS NAND gate, in accordance with some embodiments. In some embodiments, a first OR gate is provided which comprises non-linear capacitors Ca1, Ca2, and Ca3. A first terminal of capacitor Ca1 receives input a1 while a second terminal of capacitor Ca1 is coupled to a first input of NAND gate 1301. A first terminal of capacitor Ca2 receives input a2 while a second terminal of capacitor Ca2 is coupled to the first input of NAND gate 1301. A first terminal of capacitor Ca3 receives input 1 (e.g., fixed input which is tied to a power supply rail Vdd) while a second terminal of capacitor Ca3 is coupled to the first input of NAND gate 1301. In various embodiments, inputs a1 and a2 are variable inputs of the 2-input OR gate.

In some embodiments, a second OR gate is provided which comprises non-linear capacitors Cb1, Cb2, and Cb3. A first terminal of capacitor Cb1 receives input b1 while a second terminal of capacitor Cb1 is coupled to the first input of NAND gate 1301. A first terminal of capacitor Cb2 receives input b2 while a second terminal of capacitor Cb2 is coupled to the first input of NAND gate 1301. A first terminal of capacitor Cb3 receives input 1 (e.g., fixed input which is tied to a power supply rail Vdd) while a second terminal of capacitor Cb3 is coupled to the first input of NAND gate 1301. In various embodiments, inputs b1 and b2 are variable inputs of the 2-input OR gate. The output of NAND gate 1301 is "out" which indicates a complex function of OR-AND-INVERT-2-2. Here, OR-AND-INVERT-2-2 refers a function with a first OR operation of two inputs a1 and a2 using a first majority gate, a second OR operation of two inputs b1 and b2 using a second majority gate, and 2-input NAND operation on the outputs of the first majority gate and the second majority gate. These inputs can be digital, analog, or a combination of them, in accordance with some embodiments.

FIG. 13B illustrates a 6-input OR-AND-INVERT complex logic gate 1320 comprising two 3-input OR gates as majority gates and a CMOS AND gate, in accordance with some embodiments. Logic gate 1320 is like logic gate 1300 but with a larger first OR majority gate and second OR majority gate. Compared to logic gate 1300, here the first OR gate includes an additional input a3, capacitor Ca3, capacitor Ca4, and capacitor Ca5 as shown. A first terminal of capacitor Ca3 is coupled to input a3 while the second terminal of capacitor Ca3 is coupled to NAND gate 1301. A fixed input of logic 1 (e.g., fixed input which is tied to a power supply rail) is connected to first terminals of capacitors Ca4 and Ca5 while second terminals of capacitors Ca4 and Ca5 connected to the first terminal of NAND gate 1301. Here, the second OR gate includes an additional input b3 and capacitor Cb3 as shown. A first terminal of capacitor Cb3 is coupled to input b3 while the second terminal of capacitor Cb3 is coupled to a second terminal of NAND gate 1301. A fixed input of logic 1 (e.g., fixed input which is tied to a power supply rail Vdd) is connected to first terminals of capacitors Cb4 and Cb5 while second terminals of capacitor Cb4 and Cb5 are connected to the second terminal of NAND gate 1301.

The output of NAND gate 1301 of logic gate 1320 is "out" which indicates a complex function of OR-AND-INVERT-3-2. Here, OR-AND-INVERT-3-2 refers to a function with a first OR operation of three inputs a1, a2, and a3 using a first majority gate, a second OR operation of three inputs b1, b2, and b3 using a second majority gate, and a 2-input NAND operation on the outputs of the first majority gate and the second majority gate. These inputs can be digital, analog, or a combination of them, in accordance with some embodiments.

Figure 13C:
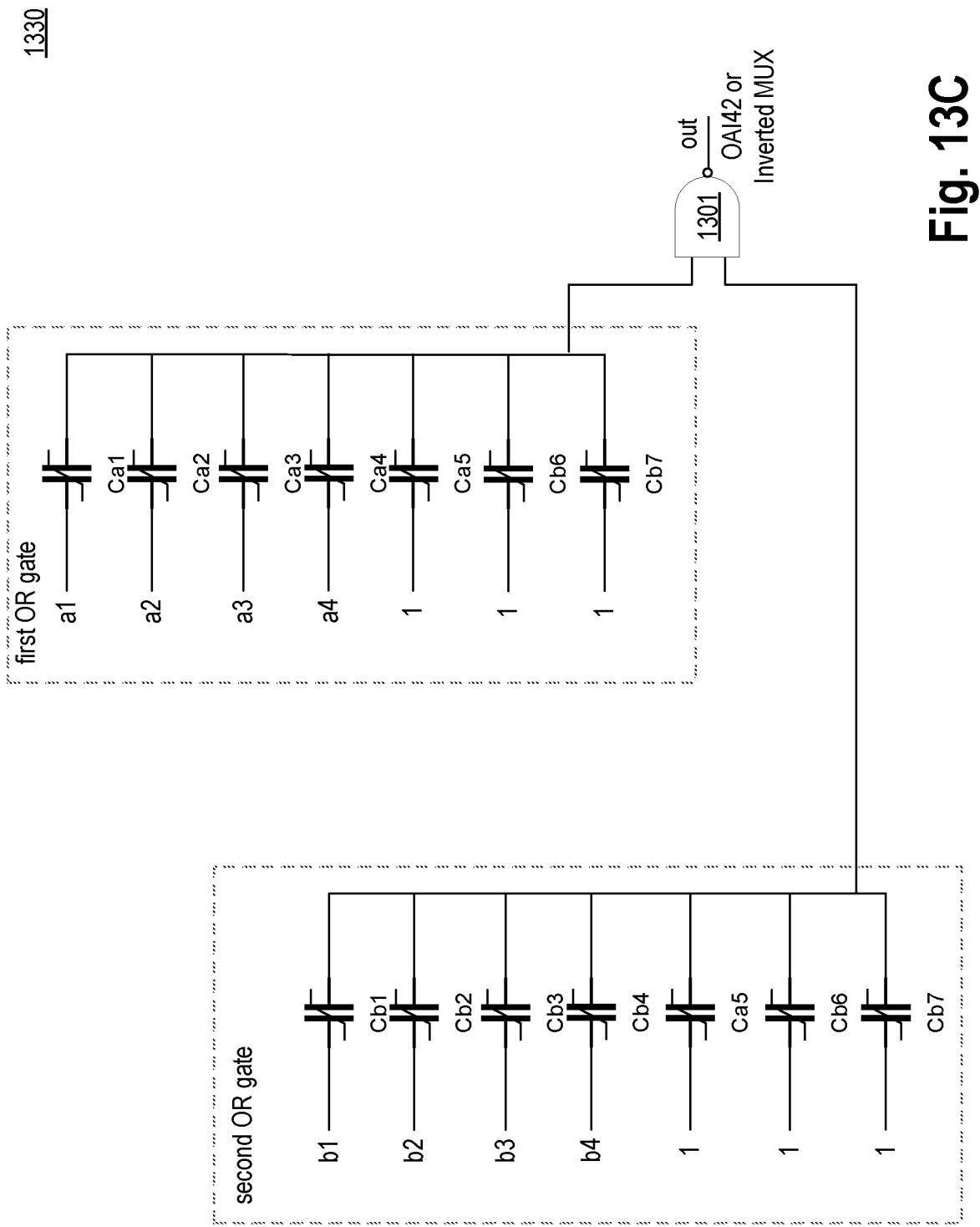
FIG. 13C illustrates an 8-input OR-AND-INVERT complex logic gate comprising two 4-input OR gates as majority gates and a CMOS AND gate, in accordance with some embodiments.

FIG. 13C illustrates an 8-input OR-AND-INVERT complex logic gate 1330 comprising two 4-input OR gates as majority gates and a CMOS AND gate, in accordance with some embodiments. Logic gate 1330 is like logic gate 1320 but with a larger first OR majority gate and second OR majority gate. Compared to logic gate 1320, here the first OR gate includes an additional input a4, capacitor Ca4, capacitor Ca5, capacitor Ca6, and capacitor Ca7 as shown. A first terminal of capacitor Ca4 is coupled to input a4 while the second terminal of capacitor Ca4 is coupled to NAND gate 1301. A fixed input of logic 1 (e.g., fixed input which is tied to a power supply rail) is connected to first terminals of capacitors Ca5, Ca6, and Ca7 while second terminals of capacitors Ca5, Ca6, and Ca7 is connected to the first terminal of NAND gate 1301. Here, the second OR gate includes additional input b4 and capacitor Cb4. A first terminal of capacitor Cb4 is coupled to input b4 while the second terminal of capacitor Cb4 is coupled to a second terminal of NAND gate 1301. A fixed input of logic 1 (e.g., fixed input which is tied to a power supply rail) is connected to first terminals of capacitors Cb5, Cb6, and Cb7 while second terminals of capacitors Cb5, Cb6, and Cb7 is connected to the second terminal of NAND gate 1301.

The output of NAND gate 1301 of logic gate 1330 is "out" which indicates a complex function of OR-AND-INVERT-4-2. Here, OR-AND-INVERT-4-2 refers to a function with a first OR operation of four inputs a1, a2, a3, and a4 using a first majority gate, a second OR operation of four inputs b1, b2, b3, and b4 using a second majority gate, and a 2-input NAND operation on the outputs of the first majority gate and the second majority gate. These inputs can be digital, analog, or a combination of them, in accordance with some embodiments.

Figure 13D:
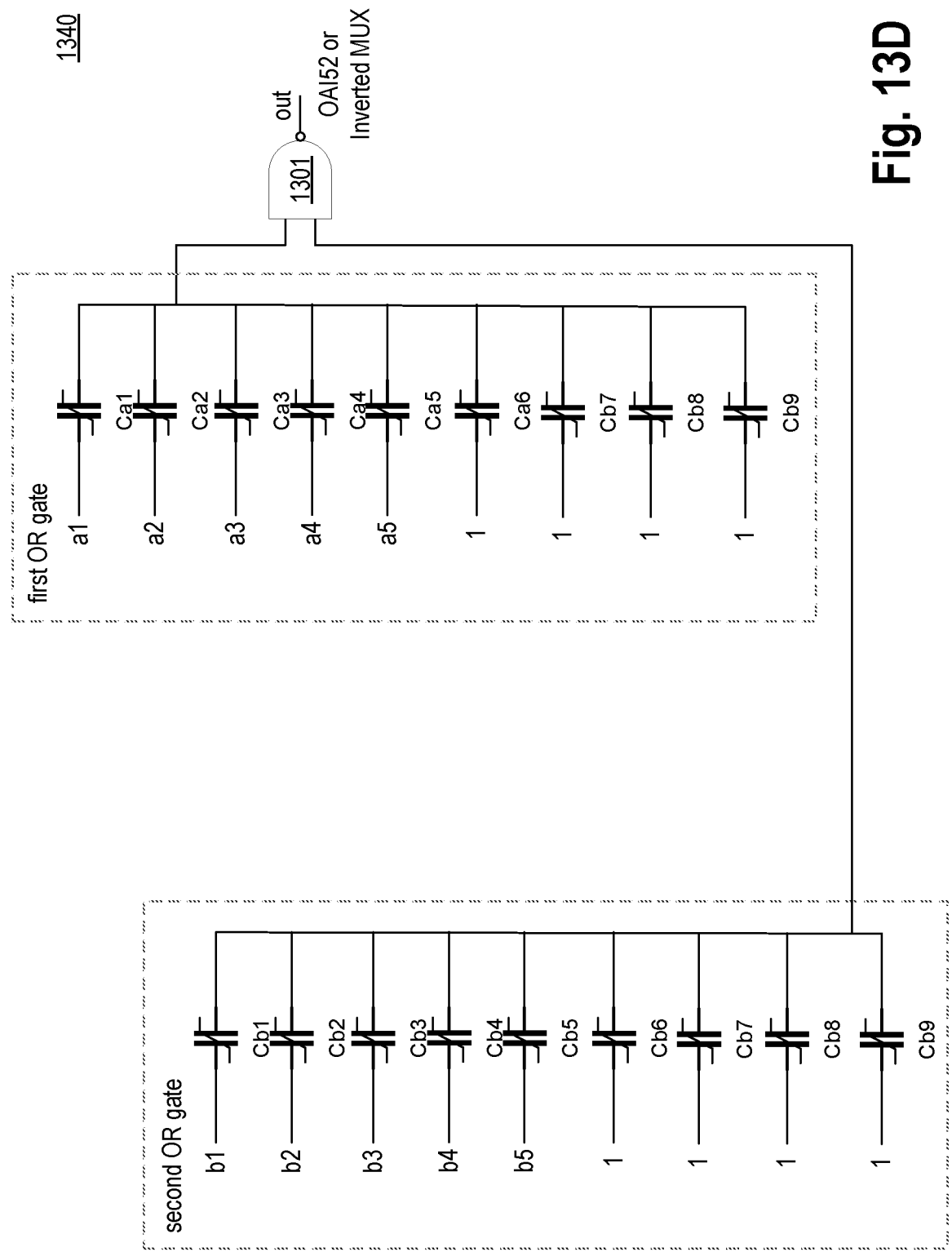
FIG. 13D illustrates a 10-input OR-AND-INVERT complex logic gate comprising two 5-input OR gates as majority gates and a CMOS AND gate, in accordance with some embodiments.

FIG. 13D illustrates a 10-input OR-AND-INVERT complex logic gate 1340 comprising two 5-input OR gates as majority gates and a CMOS AND gate, in accordance with some embodiments. Logic gate 1340 is like logic gate 1330 but with a larger first OR majority gate and second OR majority gate. Compared to logic gate 1330, here the first OR gate includes an additional input a5, capacitor Ca5, capacitor Ca6, capacitor Ca7, capacitor Cab, and capacitor Ca9. A first terminal of capacitor Ca5 is coupled to input a5 while the second terminal of capacitor Ca5 is coupled to a first terminal of NAND gate 1301. A fixed input of logic 1 (e.g., fixed input which is tied to a power supply rail) is connected to first terminals of capacitors Ca6, Ca7, Ca8, and Ca9 while second terminals of capacitors Ca6, Ca7, Ca8, and Ca9 are connected to the first terminal of NAND gate

1301. Here, the second OR gate includes additional input b5 and capacitor Cb5. A first terminal of capacitor Cb5 is coupled to input b5 while the second terminal of capacitor Cb5 is coupled to a second terminal of NAND gate 1301.

Compared to logic gate 1330, here the second OR gate includes an additional input b5, capacitor Cb5, capacitor Cb6, capacitor Cb7, capacitor Cb8, and capacitor Cb9. A first terminal of capacitor Cb5 is coupled to input b5 while the second terminal of capacitor Cb5 is coupled to a second terminal of NAND gate 1301. A fixed input of logic 1 (e.g., fixed input which is tied to a power supply rail) is connected to first terminals of capacitors Cb6, Cb7, Cb8, and Cb9 while second terminals of capacitors Cb6, Cb7, Cb8, and Cb9 are connected to the second terminal of NAND gate 1301. The output of NAND gate 1301 of logic gate 1330 is "out" which indicates a complex function of OR-AND-INVERT-5-2. Here, OR-AND-INVERT-5-2 refers to a function with a first OR operation of four inputs a1, a2, a3, a4, and a5 using a first majority gate, a second OR operation of four inputs b1, b2, b3, b4, and b5 using a second majority gate, and a 2-input NAND operation on the outputs of the first majority gate and the second majority gate. These inputs can be digital, analog, or a combination of them, in accordance with some embodiments.

Figure 14:
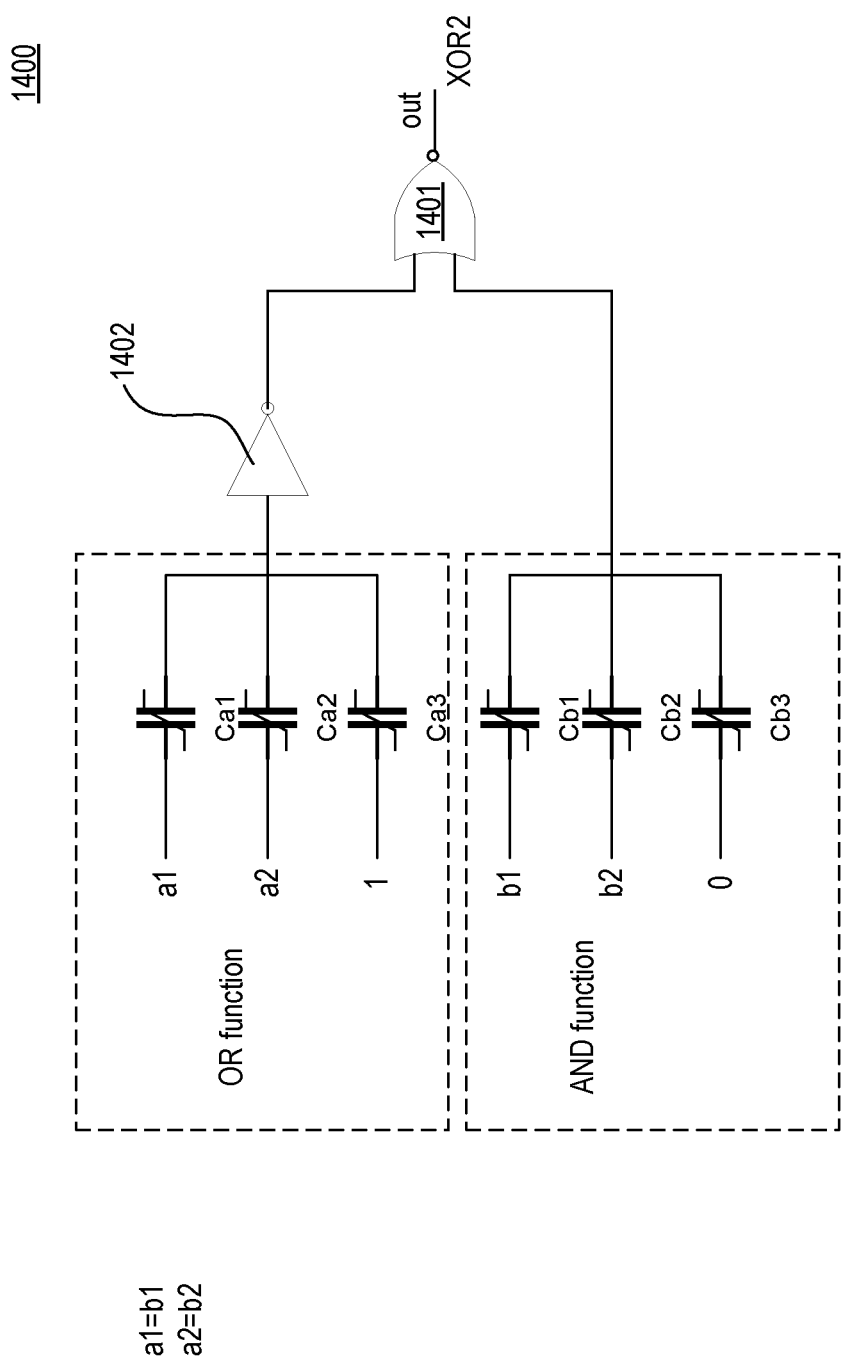
FIG. 14 illustrates a 4-input XOR gate comprising a 2-input OR gate as a majority gate and a 2-input NOR gate as a majority gate, in accordance with some embodiments.

FIG. 14 illustrates a 2-input XOR gate 1400 comprising a 2-input OR gate as a majority gate and a 2-input NOR gate as a majority gate, in accordance with some embodiments. XOR gate 1400 further comprises NOR gate 1401 and inverter 1402. Here, the 2-input OR gate comprises capacitors Ca1, Ca2, and Ca3. A first terminal of capacitor Ca1 is coupled to input a1 while a second terminal of capacitor Ca1 is coupled to an input of inverter 1402. A first terminal of capacitor Ca2 is coupled to input a2 while a second terminal of capacitor Ca2 is coupled to the input of inverter 1402. A first terminal of capacitor Ca3 is coupled to a fixed input 1 (e.g., input tied to a power supply rail) while a second terminal of capacitor Ca3 is coupled to the input of inverter 1402. The output of inverter 1402 is coupled to a first input of NOR gate 1401.

Here, the 2-input AND gate comprises capacitors Cb1, Cb2, and Cb3. A first terminal of capacitor Cb1 is coupled to input b1 while a second terminal of capacitor Cb1 is coupled to a second input of NOR gate 1401. A first terminal of capacitor Cb2 is coupled to input b2 while a second terminal of capacitor Cb2 is coupled to the second input of NOR gate 1401. A first terminal of capacitor Cb3 is coupled to a fixed input 0 (e.g., input tied to a ground supply rail) while a second terminal of capacitor Cb3 is coupled to the second input of NOR gate 1401. The output of NOR gate 1401 is "out" which is the XOR function of inputs a1 and a2, where a1 and b1 receive the same input while a2 and b2 receive the same input.

Figure 15:
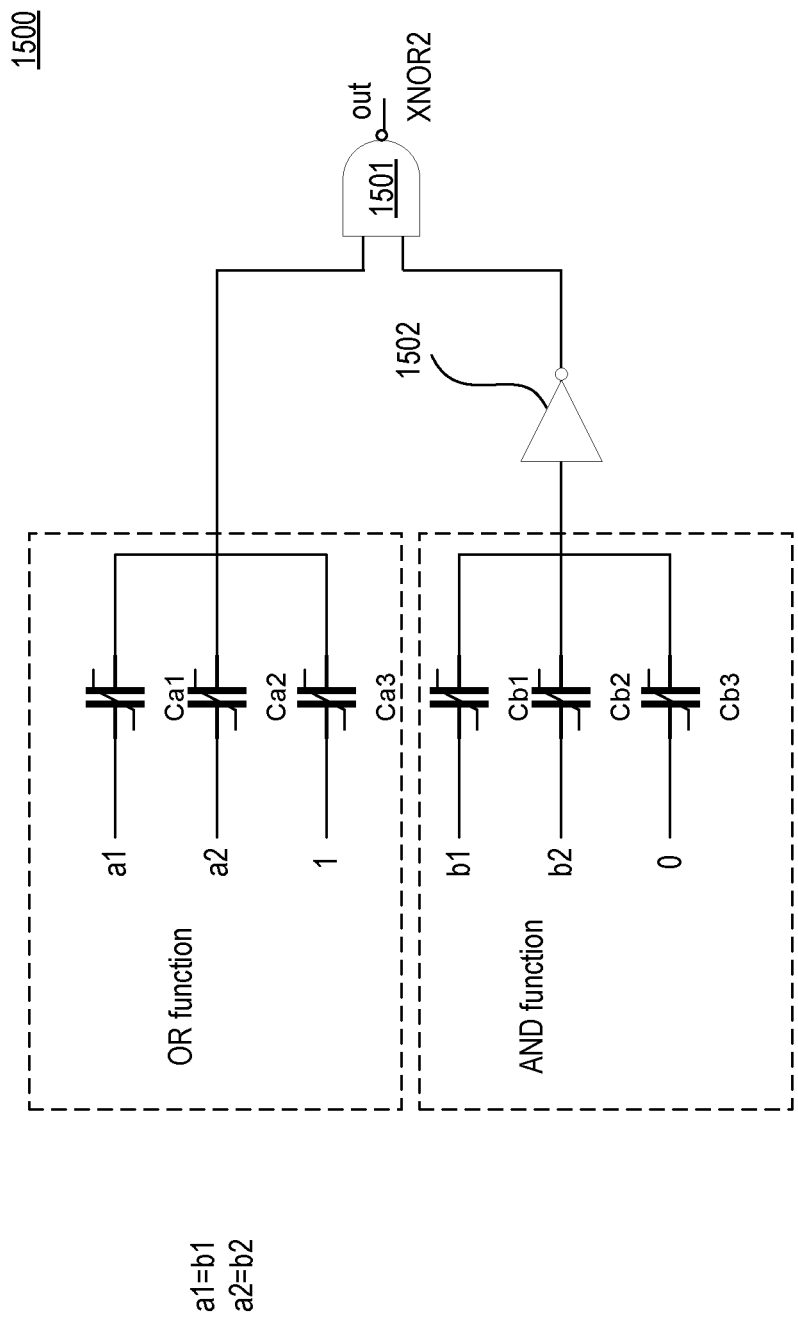
FIG. 15 illustrates a 4-input XNOR gate comprising a 2-input OR gate as a majority gate and a 2-input AND gate as a majority gate, in accordance with some embodiments.

FIG. 15 illustrates a 2-input XNOR gate 1500 comprising a 2-input OR gate as a majority gate and a 2-input AND gate as a majority gate, in accordance with some embodiments. XNOR gate 1500 further comprises NAND gate 1501 and inverter 1502. Here, the 2-input OR gate comprises capacitors Ca1, Ca2, and Ca3. A first terminal of capacitor Ca1 is coupled with input a1 while a second terminal of capacitor Ca1 is coupled to a first input of NAND gate 1501. A first terminal of capacitor Ca2 is coupled with input a2 while a second terminal of capacitor Ca2 is coupled to the first input of NAND gate 1501. A first terminal of capacitor Ca3 is coupled with a fixed input 1 (e.g., input tied to a power supply rail) while a second terminal of capacitor Ca3 is coupled to the first input of NAND gate 1501.

Here, the 2-input AND gate comprises capacitors Cb1, Cb2, and Cb3. A first terminal of capacitor Cb1 is coupled input b1 while a second terminal of capacitor Cb1 is coupled to an input of inverter 1502. A first terminal of capacitor Cb2 is coupled with input b2 while a second terminal of capacitor Cb2 is coupled to the input of inverter 1502. A first terminal of capacitor Cb3 is coupled with a fixed input 0 (e.g., input tied to a ground supply rail) while a second terminal of capacitor Cb3 is coupled to the input of inverter 1502. The output of inverter 1502 is coupled to a second input of NAND gate 1501. The output of NAND gate 1501 is "out" which is the XNOR function of inputs a1 and a2, where a1 and b1 receive the same input while a2 and b2 receive the same input.

In some embodiments, the non-linear polar material based capacitors are planar capacitors. In some embodiments, the non-linear polar material based capacitors are trench or pillar capacitors. In some embodiments, the planar capacitors are laterally positioned relative to one another. In some embodiments, the planar capacitors are vertically positioned, one on top of the other. In some embodiments, the trench or pillar capacitors are laterally positioned relative to one another. In some embodiments, the trench or pillar capacitors are vertically positioned, one on top of the other.

Figure 16:
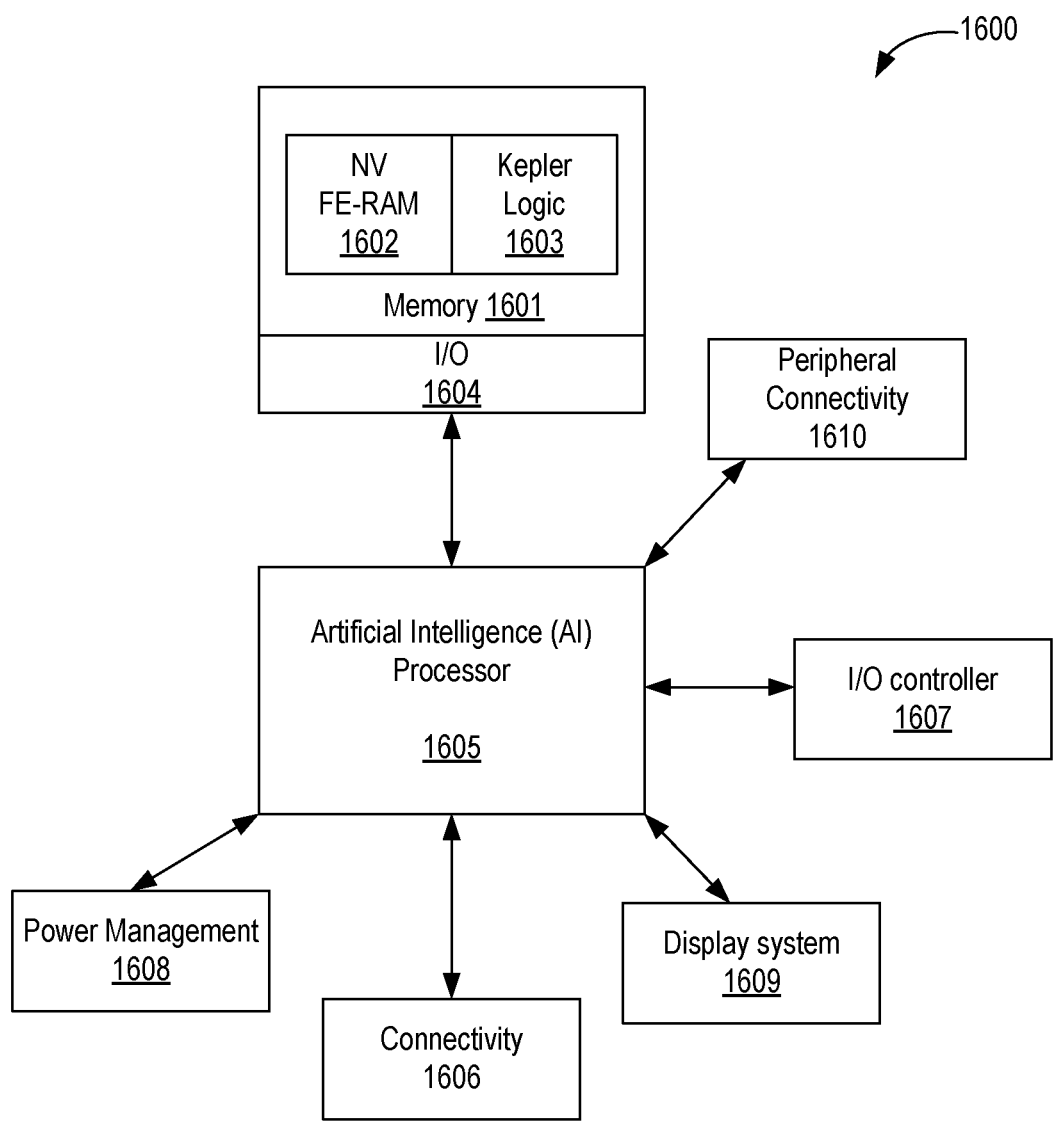
FIG. 16 illustrates a system-on-chip (SOC) that uses the majority logic gates having non-linear input capacitors, in accordance with some embodiments.

FIG. 16 illustrates a system-on-chip (SOC) 1600 that uses the majority logic gates having non-linear input capacitors, in accordance with some embodiments. SOC 1600 comprises memory 1601 having static random-access memory (SRAM) or FE based random access memory FE-RAM, or any other suitable memory. The memory can be non-volatile (NV) or volatile memory. Memory 1601 may also comprise logic 1603 to control memory 1602. For example, write and read drivers are part of logic 1603. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 1604. The interface may be double-data rate (DDR) compliant interface or any other suitable interface to communicate with a processor. Processor 1605 of SOC 1600 can be a single core or multiple core processor. Processor 1605 can be a general-purpose processor (CPU), a digital signal processor (DSP), or an Application Specific Integrated Circuit (ASIC) processor. In some embodiments, processor 1605 is an artificial intelligence (AI) processor (e.g., a dedicated AI processor, a graphics processor configured as an AI processor). In various embodiments, processor 1605 is a processor circuitry which is to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 1605 may be coupled to a number of other chip-lets that can be on the same die as SOC 1600 or on separate dies. These chip-lets include connectivity circuitry 1606, I/O controller 1607, power management 1608, and display system 1609, and peripheral connectivity 1610.

Connectivity 1606 represents hardware devices and software components for communicating with other devices. Connectivity 1606 may support various connectivity circuitries and standards. For example, connectivity 1606 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1606 may support non-cellular standards such as WiFi.

I/O controller 1607 represents hardware devices and software components related to interaction with a user. I/O controller 1607 is operable to manage hardware that is part of an audio subsystem and/or display subsystem. For example, input through a microphone or other audio device can provide input or commands for one or more applications or functions of SOC 1600. In some embodiments, I/O controller 1607 illustrates a connection point for additional devices that connect to SOC 1600 through which a user might interact with the system. For example, devices that can be attached to the SOC 1600 might include microphone devices, speaker or stereo systems, video systems or other display devices, keyboard or keypad devices, or other I/O devices for use with specific applications such as card readers or other devices.

Power management 1608 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1608 may accordingly put such logic into low power state without the worry of losing data. Power management may select a power state according to Advanced Configuration and Power Interface (ACPI) specification for one or all components of SOC 1600.

Display system 1609 represents hardware (e.g., display devices) and software (e.g., drivers) components that provide a visual and/or tactile display for a user to interact with the processor 1605. In some embodiments, display system 1609 includes a touch screen (or touch pad) device that provides both output and input to a user. Display system 1609 may include a display interface, which includes the particular screen or hardware device used to provide a display to a user. In some embodiments, the display interface includes logic separate from processor 1605 to perform at least some processing related to the display.

Peripheral connectivity 1610 may represent hardware devices and/or software devices for connecting to peripheral devices such as printers, chargers, cameras, etc. Peripheral connectivity 1610 may support communication protocols, e.g., PCIe (Peripheral Component Interconnect Express), USB (Universal Serial Bus), Thunderbolt, High-Definition Multimedia Interface (HDMI), Firewire, etc.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" may generally refer to a direct connection, such as electrical, mechanical, or magnetic connection between the things that are connected, without any intermediary devices.

The term "coupled" may generally refer a direct or indirect connection, such as a direct electrical, mechanical, or magnetic connection between the things that are connected or an indirect connection, through one or more passive or active intermediary devices.

The term "adjacent" here may generally refer to a position of a thing being next to (e.g., immediately next to or close to with one or more things between them) or adjoining another thing (e.g., abutting it).

The term "circuit" or "module" may generally refer to one or more passive and/or active components that are arranged to cooperate with one another to provide a desired function.

The term "signal" may generally refer to at least one current signal, voltage signal, magnetic signal, or data/clock signal. The meaning of "a," "an," and "the" include plural references. The meaning of "in" includes "in" and "on."

Here, the term "analog signal" may generally refer to any continuous signal for which the time varying feature (variable) of the signal is a representation of some other time varying quantity, i.e., analogous to another time varying signal.

Here, the term "digital signal" may generally refer to a physical signal that is a representation of a sequence of discrete values (a quantified discrete-time signal), for example of an arbitrary bit stream, or of a digitized (sampled and analog-digital converted) analog signal.

The term "scaling" may generally refer to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," may generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left" "right," "front," "back,", "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein may generally refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" may generally refer to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention. For example, example 7 can be combined with example 3 or 2, or both.

Example 1: An apparatus comprising: a first capacitor to receive a first input, the first capacitor coupled to a node; a second capacitor to receive a second input, the second capacitor coupled to the node; a third capacitor to receive a third input, wherein the third capacitor is coupled to the node; a fourth capacitor to receive a fourth input, the fourth capacitor coupled to the node; a fifth capacitor to receive a fifth input, the fifth capacitor coupled to the node; a sixth capacitor to receive a sixth input, wherein the sixth capacitor is coupled to the node, wherein the first input, the second input, the fourth input, and the fifth input are variable inputs, and wherein the third input and the fourth input are pulled to a ground supply level; and a NOR gate with its inputs coupled to the node.

Example 2: The apparatus of example 1, wherein the first capacitor, the second capacitor, the third capacitor, the fourth capacitor, the fifth capacitor, and the sixth capacitor include non-linear polar material.

Example 3: The apparatus of example 2, wherein the non-linear polar material includes one of: ferroelectric material, paraelectric material, or non-linear dielectric.

Example 4: The apparatus of example 3, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1–x Ex Oy, where E can be Al, Ca, Ce, Dy, Er, Gd, Ge, La, Sc, Si, Sr, Sn, or Y; Al(1–x)Sc(x)N, Ga(1–x)Sc(x)N, Al(1–x)Y(x)N or Al(1–x–y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

Example 5: The apparatus of example 3, wherein the paraelectric material includes one of: SrTiO3, Ba(x)Sr(y)TiO3, HfZrO2, Hf—Si—O, La-substituted PbTiO3, or PMN-PT based relaxor ferroelectrics.

Example 6: The apparatus of example 3, wherein the paraelectric material includes one of: Sr, Ti, Ba, Hf, Zr, Si, La, or Pb.

Example 7: The apparatus of example 1, wherein the first input, the second input, and the third input are digital signals, wherein the node has a voltage such that leakage through the NOR gate is reduced.

Example 8: The apparatus of example 1 wherein the NOR gate is a CMOS based NOR gate.

Example 9: The apparatus of example 1, wherein the first capacitor, the second capacitor, and the third capacitor together operate as a first AND gate, wherein the fourth capacitor, the fifth capacitor, and the sixth capacitor together operate as a second AND gate.

Example 10: An apparatus comprising: a first AND gate comprising a first plurality of capacitors to receive a first plurality of inputs, respectively, wherein at least one input of the first plurality of inputs is a first fixed input while other inputs of the first plurality of inputs are variable inputs; a second AND gate comprising a second plurality of capacitors to receive a second plurality of inputs, respectively, wherein at least one input of the second plurality of inputs is a second fixed input while other inputs of the second plurality of inputs are variable inputs; and a NOR gate having a first input and a second input, wherein the first input is coupled to an output of the first AND gate, and wherein the second input is coupled to an output of the second AND gate.

Example 11: The apparatus of example 10, wherein individual capacitors of the first plurality of capacitors have substantially first equal leakages, wherein individual capacitors of the second plurality of capacitors have substantially second equal leakages.

Example 12: The apparatus of example 10, wherein individual capacitors of the first plurality of capacitors have symmetric first current-voltage behavior, wherein individual capacitors of the second plurality of capacitors have symmetric second current-voltage behavior.

Example 13: The apparatus of example 10, wherein the first plurality of capacitors comprises non-linear polar material which includes one of: ferroelectric material, paraelectric material, or non-linear dielectric.

Example 14: The apparatus of example 13, wherein the ferroelectric material includes any of the ferroelectric materials discussed herein.

Example 15: The apparatus of example 10, wherein the first fixed input and the second fixed input are coupled to a ground supply rail.

Example 16: A system comprising: a processor circuitry to execute one or more instructions; a communication interface communicatively coupled to the processor circuitry; and a memory coupled to the processor circuitry, wherein the processor circuitry comprises an and-or-inverter gate which includes an apparatus according to any one of examples 1 to 9.

Example 17: A system comprising: a processor circuitry to execute one or more instructions; a communication interface communicatively coupled to the processor circuitry; and a memory coupled to the processor circuitry, wherein the processor circuitry comprises an and-or-inverter gate which includes an apparatus according to any one of examples 10 to 15.

Example 1a: An apparatus comprising: a first capacitor to receive a first input, the first capacitor coupled to a node; a second capacitor to receive a second input, the second capacitor coupled to the node; a third capacitor to receive a third input, wherein the third capacitor is coupled to the node; a fourth capacitor to receive a fourth input, the fourth capacitor coupled to the node; a fifth capacitor to receive a fifth input, the fifth capacitor coupled to the node; a sixth capacitor to receive a sixth input, wherein the sixth capacitor is coupled to the node, wherein the first input, the second input, the fourth input, and the fifth input are variable inputs, and wherein the third input and the fourth input are pulled down to a power supply level; and a NAND gate with its inputs coupled to the node.

Example 2a: The apparatus of claim 1, wherein the first capacitor, the second capacitor, the third capacitor, the fourth capacitor, the fifth capacitor, and the sixth capacitor include non-linear polar material.

Example 3a: The apparatus of claim 2, wherein the non-linear polar material includes one of: ferroelectric material, paraelectric material, or non-linear dielectric.

Example 4a: The apparatus of claim 3, wherein the ferroelectric material includes any of the ferroelectric materials discussed herein.

Example 5a: The apparatus of claim 3, wherein the paraelectric material includes one of: SrTiO3, Ba(x)Sr(y)TiO3, HfZrO2, Hf—Si—O, La-substituted PbTiO3, or PMN-PT based relaxor ferroelectrics.

Example 6a: The apparatus of claim 3, wherein the paraelectric material includes one of: Sr, Ti, Ba, Hf, Zr, Si, La, or Pb.

Example 7a: The apparatus of claim 1, wherein the first input, the second input, and the third input are digital signals, wherein the node has a voltage such that leakage through the NAND gate is reduced.

Example 8a: The apparatus of claim 1 wherein the NAND gate is a CMOS based NAND gate.

Example 9a: The apparatus of claim 1, wherein the first capacitor, the second capacitor, and the third capacitor together operate as a first OR gate, wherein the fourth capacitor, the fifth capacitor, and the sixth capacitor together operate as a second OR gate.

Example 10a: An apparatus comprising: a first OR gate comprising a first plurality of capacitors to receive a first plurality of inputs, respectively, wherein at least one input of the first plurality of inputs is a first fixed input while other inputs of the first plurality of inputs are variable inputs; a second OR gate comprising a second plurality of capacitors to receive a second plurality of inputs, respectively, wherein at least one input of the second plurality of inputs is a second fixed input while other inputs of the second plurality of inputs are variable inputs; and a NAND gate having a first input and a second input, wherein the first input is coupled to an output of the first OR gate, and wherein the second input is coupled to an output of the second OR gate.

Example 11a: The apparatus of claim 10, wherein individual capacitors of the first plurality of capacitors have substantially first equal leakages, wherein individual capacitors of the second plurality of capacitors have substantially second equal leakages.

Example 12a: The apparatus of claim 10, wherein individual capacitors of the first plurality of capacitors have symmetric first current-voltage behavior, wherein individual capacitors of the second plurality of capacitors have symmetric second current-voltage behavior.

Example 13a: The apparatus of claim 10, wherein the first plurality of capacitors comprises non-linear polar material which includes one of: ferroelectric material, para-electric material, or non-linear dielectric.

Example 14a: The apparatus of claim 13, wherein the ferroelectric material includes any one of the ferroelectric materials discussed herein.

Example 15a: The apparatus of claim 10, wherein the first fixed input and the second fixed input are coupled to a power supply rail.

Example 16a: A system comprising: a processor circuitry to execute one or more instructions; a communication interface communicatively coupled to the processor circuitry; and a memory coupled to the processor circuitry, wherein the processor circuitry comprises an and-or-inverter gate which includes an apparatus according to any one of examples 1a to 9a.

Example 16a: A system comprising: a processor circuitry to execute one or more instructions; a communication interface communicatively coupled to the processor circuitry; and a memory coupled to the processor circuitry, wherein the processor circuitry comprises an and-or-inverter gate which includes an apparatus according to any one of examples 10a to 15a.

Example 1b: An apparatus comprising: a first capacitor to receive a first input, the first capacitor coupled to a node; a second capacitor to receive a second input, the second capacitor coupled to the node; and a third capacitor to receive a third input, wherein the third capacitor is coupled to the node, wherein the first capacitor, the second capacitor, and the third capacitor comprise non-linear polar material, wherein the first capacitor, the second capacitor, and the third capacitor have substantially equal leakages.

Example 2b: The apparatus of example 1b, wherein the node is independent of a reset transistor connected to it.

Example 3b: The apparatus of example 1b, wherein voltage on the node is close to rail-to-rail such that leakage through a gate connected to the node is reduced.

Example 4b: The apparatus of example 1b, wherein the first capacitor, the second capacitor, and the third capacitor are leaky capacitors.

Example 5b: The apparatus of example 1b, wherein leakage of the first capacitor, the second capacitor, and the third capacitor creates a resistive majority at the node that dominates under steady state.

Example 6b: The apparatus of example 1b, wherein non-linear functions of the first capacitor, the second capacitor, and the third capacitor creates a capacitive majority at the node that dominates under active state.

Example 7b: The apparatus of example 1b, wherein leakage of the first capacitor, the second capacitor, and the third capacitor is high enough to maintain a majority function at the node.

Example 8b: The apparatus of example 1b, wherein leakage of the first capacitor, the second capacitor, or the third capacitor has a symmetric current-voltage behavior.

Example 9b: The apparatus of example 1b, wherein the non-linear polar material includes one of: ferroelectric material, paraelectric material, or non-linear dielectric.

Example 10b: The apparatus of example 9b, wherein the ferroelectric material includes any one of the ferroelectric materials discussed herein.

Example 11b: The apparatus of example 9b, wherein the paraelectric material includes one of: SrTiO3, Ba(x)Sr(y)TiO3, HfZrO2, Hf—Si—O, La-substituted PbTiO3, or PMN-PT based relaxor ferroelectrics.

Example 12b: The apparatus of example 9b, wherein the paraelectric material includes one of: Sr, Ti, Ba, Hf, Zr, Si, La, or Pb.

Example 13b: The apparatus of example 1b, wherein the first input, the second input, and the third input are digital signals.

Example 14b: An apparatus comprising: a first capacitor to receive a first input, the first capacitor coupled to a node, wherein the first capacitor has a first leakage; a second capacitor to receive a second input, the second capacitor coupled to the node, wherein the second capacitor has a second leakage; and a third capacitor to receive a third input, wherein the third capacitor is coupled to the node, wherein the third capacitor has a third leakage, wherein the first capacitor, the second capacitor, and the third capacitor comprise non-linear polar material, wherein the first leakage, the second leakage, and the third leakage creates a resistive majority at the node that dominates under steady state.

Example 15b: The apparatus of example 14b, wherein the first leakage, the second leakage, and the third leakage are substantially equal.

Example 16b: The apparatus of example 14b, wherein the node is independent of a reset transistor connected to it.

Example 17b: The apparatus of example 14b, wherein non-linear functions of the first capacitor, the second capacitor, and the third capacitor creates a capacitive majority at the node that dominates under active state.

Example 18b: The apparatus of example 14b, wherein first leakage, the second leakage, and the third leakage are high enough to maintain a majority function at the node.

Example 19b: The apparatus of example 14b, wherein the first leakage, the second leakage, or the third leakage has a symmetric current-voltage behavior.

Example 20b: A system comprising: a processor circuitry to execute one or more instructions; a communication interface communicatively coupled to the processor circuitry; and a memory coupled to the processor circuitry, wherein the processor circuitry comprises an and-or-inverter gate which includes any one of examples 1b to 13b.

Example 1c: An apparatus comprising: a first AND-OR-INVERT gate comprising first two AND gates and a first NOR gate, wherein outputs of the first two AND gates are coupled to inputs of the first NOR gate, wherein the first two AND gates include input capacitors with non-linear polar material; a second AND-OR-INVERT gate comprising second two AND gates and a second NOR gate, wherein outputs of the second two AND gates are coupled to inputs of the second NOR gate, wherein the second two AND gates include input capacitors with non-linear polar material; and a NAND gate to receive outputs of the first AND-OR-INVERT gate and the second AND-OR-INVERT gate.

Example 2c: The apparatus of example 1c, wherein the first AND-OR-INVERT gate comprises: a first capacitor to receive a first input, the first capacitor coupled to a first node; a second capacitor to receive a second input, the second capacitor coupled to the first node; a third capacitor to receive a third input, wherein the third capacitor is coupled to the first node; a fourth capacitor to receive a fourth input, the fourth capacitor coupled to the first node; a fifth capacitor to receive a fifth input, the fifth capacitor coupled to the first node; a sixth capacitor to receive a sixth input, wherein the sixth capacitor is coupled to a second node; a seventh capacitor to receive a seventh input, wherein the seventh capacitor is coupled to the second node; an eighth capacitor to receive an eighth input, wherein the eighth capacitor is coupled to the second node; a ninth capacitor to receive a ninth input, wherein the ninth capacitor is coupled to the second node; and a tenth capacitor to receive a tenth input, wherein the tenth capacitor is coupled to the second node, wherein the first input, the second input, the third input, the sixth input, the seventh input, and the eighth input are variable inputs, and wherein the fourth input, the fifth input, the ninth input, and the tenth input are pulled to a ground supply level, wherein the first NOR gate is coupled to the first node and the second node.

Example 3c: The apparatus of example 2c, wherein: the second input is coupled to a first select input; the third input is coupled to a second select input; the sixth input is coupled to the first select input; and the seventh input is coupled a complementary of the second select input.

Example 4c: The apparatus of example 3c, wherein the second AND-OR-INVERT gate comprises: an eleventh capacitor to receive an eleventh input, the eleventh capacitor coupled to a third node; a twelfth capacitor to receive a twelfth input, the twelfth capacitor coupled to the third node; a thirteenth capacitor to receive a thirteenth input, wherein the thirteenth capacitor is coupled to the third node; a fourteenth capacitor to receive a fourteenth input, the fourteenth capacitor coupled to the third node; a fifteenth capacitor to receive a fifteenth input, the fifteenth capacitor coupled to the third node; a sixteenth capacitor to receive a sixteenth input, wherein the sixteenth capacitor is coupled to a fourth node; a seventeenth capacitor to receive a seventeenth input, wherein the seventeenth capacitor is coupled to the fourth node; an eighteenth capacitor to receive an eighteenth input, wherein the eighteenth capacitor is coupled to the fourth node; a nineteenth capacitor to receive a nineteenth input, wherein the nineteenth capacitor is coupled to the fourth node; and a twentieth capacitor to receive a twentieth input, wherein the twentieth capacitor is coupled to the fourth node, wherein the eleventh input, the twelfth input, the thirteenth input, the sixteenth input, the seventeenth input, and the eighteenth input are variable inputs, and wherein the fourteenth input, the fifteenth input, the nineteenth input, and the twentieth input are pulled to the ground supply level, wherein the second NOR gate is coupled to the third node and the fourth node.

Example 5c: The apparatus of example 4c, wherein: the twelfth input is coupled to a complimentary of the first select input; the thirteenth input is coupled to the second select input; the sixteenth input is coupled to the complimentary of the first select input; and the seventeenth input is coupled to the complimentary of the second select input.

Example 6c: The apparatus of example 1c, wherein the NAND gate is a CMOS NAND gate.

Example 7c: The apparatus of example 1c, wherein the NAND gate comprises capacitors with non-linear polar material.

Example 8c: The apparatus of example 1c, wherein the non-linear polar material includes one of: ferroelectric material, paraelectric material, or non-linear dielectric.

Example 9c: The apparatus of example 8c, wherein the ferroelectric material includes any one of the ferroelectric materials discussed herein.

Example 10c: The apparatus of example 8c, wherein the paraelectric material includes one of: SrTiO3, Ba(x)Sr(y)TiO3, HfZrO2, Hf—Si—O, La-substituted PbTiO3, or PMN-PT based relaxor ferroelectrics.

Example 11c: The apparatus of example 8c, wherein the paraelectric material includes one of: Sr, Ti, Ba, Hf, Zr, Si, La, or Pb.

Example 12c: An apparatus comprising: a first pair of select inputs; a second pair of select inputs, wherein the second pair of select inputs is complementary to the first pair of select inputs; a set of inputs; two AND-OR-INVERT gates to receive the first pair of select inputs, the second pair of select inputs, and the set of inputs; and a NAND gate coupled to outputs of the two AND-OR-INVERT gates, wherein the two AND-OR-INVERT gates comprises AND gates including a plurality of capacitors with non-linear polar material.

Example 13c: The apparatus of example 12c, wherein individual capacitors of the plurality of capacitors have substantially equal leakages.

Example 14c: The apparatus of example 12c, wherein individual capacitors of the plurality of capacitors have symmetric current-voltage behavior.

Example 15c: The apparatus of example 12c, wherein the NAND gate is a CMOS NAND gate, or wherein the NAND gate comprises non-linear polar material.

Example 16c: The apparatus of example 12c, wherein the first pair of select input and the second pair of select inputs are conditioned to select an input, from the set of inputs, as an output of the NAND gate.

Example 17c: The apparatus of example 12c, wherein the non-linear polar material includes one of: ferroelectric material, paraelectric material, or non-linear dielectric.

Example 18c: A system comprising: a processor circuitry to execute one or more instructions; a communication interface communicatively coupled to the processor circuitry; and a memory coupled to the processor circuitry, wherein the processor circuitry comprises a multiplexer which includes any one of examples 1c to 11c.

Example 18c: A system comprising: a processor circuitry to execute one or more instructions; a communication interface communicatively coupled to the processor circuitry; and a memory coupled to the processor circuitry, wherein the processor circuitry comprises a multiplexer which includes any one of examples 12c to 18c.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first capacitor to receive a first input, the first capacitor coupled to a first node;
   a second capacitor to receive a second input, the second capacitor coupled to the first node;
   a third capacitor to receive a third input, wherein the third capacitor is coupled to the first node;
   a fourth capacitor to receive a fourth input, the fourth capacitor coupled to a second node;
   a fifth capacitor to receive a fifth input, the fifth capacitor coupled to the second node;
   a sixth capacitor to receive a sixth input, wherein the sixth capacitor is coupled to the second node, wherein the first input, the second input, the fourth input, and the fifth input are variable inputs, and wherein the third input and the sixth input are pulled to a ground supply level; and
   a NOR gate with its inputs directly coupled to the first node and the second node respectively.

2. The apparatus of claim 1, wherein the first capacitor, the second capacitor, the third capacitor, the fourth capacitor, the fifth capacitor, and the sixth capacitor include non-linear polar material.

3. The apparatus of claim 2, wherein the non-linear polar material includes one of: ferroelectric material, paraelectric material, or non-linear dielectric.

4. The apparatus of claim 3, wherein the ferroelectric material includes one of:
   bismuth ferrite (BFO) with a first doping material, wherein the first doping material is one of Lanthanum or elements from lanthanide series of periodic table;
   lead zirconium titanate (PZT) or PZT with a second doping material, wherein the second doping material is one of La or Nb;
   a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
   a perovskite which includes one of: BaTiO3, PbTiO3, KNbO3, or NaTaO3;
   a hexagonal ferroelectric which includes one of: YMnO3 or LuFeO3;
   hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
   hafnium (Hf), Zirconium (Zr), Aluminum (Al), Silicon (Si), their oxides or their alloyed oxides;
   hafnium oxides as Hf1–x Ex Oy, where E can be Al, Ca, Ce, Dy, Er, Gd, Ge, La, Sc, Si, Sr, Sn, or Y;
   Al(1–x)Sc(x)N, Ga(1–x)Sc(x)N, Al(1–x)Y(x)N or Al(1–x–y)Mg(x)Nb(y)N, y doped HfO2, where 'y' includes one of: Al, Ca, Ce, Dy, Er, Gd, Ge, La, Sc, Si, Sr, Sn, or Y, wherein 'x' is a fraction;
   niobate type compounds LiNbO3, LiTaO3, Lithium iron Tantalum Oxy Fluoride, Barium Strontium Niobate, Sodium Barium Niobate, or Potassium strontium niobate; or
   an improper ferroelectric which includes one of: [PTO/STO]n or [LAO/STO]n, where 'n' is between 1 to 100.

5. The apparatus of claim 3, wherein the paraelectric material includes one of:
   SrTiO3, Ba(x)Sr(y)TiO3, HfZrO2, Hf—Si—O, La-substituted PbTiO3, or PMN-PT based relaxor ferroelectrics.

6. The apparatus of claim 3, wherein the paraelectric material includes one of: Sr, Ti, Ba, Hf, Zr, Si, La, or Pb.

7. The apparatus of claim 1, wherein the first input, the second input, and the third input are digital signals, and wherein the first or second node has a voltage such that leakage through the NOR gate is reduced.

8. The apparatus of claim 1 wherein the NOR gate is a CMOS based NOR gate.

9. The apparatus of claim 1, wherein the first capacitor, the second capacitor, and the third capacitor together operate as a first AND gate, and wherein the fourth capacitor, the fifth capacitor, and the sixth capacitor together operate as a second AND gate.

10. An apparatus comprising:
    a first AND gate comprising a first plurality of capacitors to receive a first plurality of inputs, respectively, wherein at least one input of the first plurality of inputs is a first fixed input while other inputs of the first plurality of inputs are variable inputs and wherein the first plurality of capacitors comprises non-linear polar material;
    a second AND gate comprising a second plurality of capacitors to receive a second plurality of inputs, respectively, wherein at least one input of the second plurality of inputs is a second fixed input while other inputs of the second plurality of inputs are variable inputs; and
    a NOR gate having a first input and a second input, wherein the first input is directly coupled to an output of the first AND gate, and wherein the second input is directly coupled to an output of the second AND gate.

11. The apparatus of claim 10, wherein individual capacitors of the first plurality of capacitors have substantially first equal leakages, and wherein individual capacitors of the second plurality of capacitors have substantially second equal leakages.

12. The apparatus of claim 10, wherein individual capacitors of the first plurality of capacitors have symmetric first current-voltage behavior, and wherein individual capacitors of the second plurality of capacitors have symmetric second current-voltage behavior.

13. The apparatus of claim 10, wherein the non-linear polar material includes one of: ferroelectric material, paraelectric material, or non-linear dielectric.

14. The apparatus of claim 13, wherein the ferroelectric material includes one of:
   bismuth ferrite (BFO) with a first doping material, wherein the first doping material is one of Lanthanum or elements from lanthanide series of periodic table;
   lead zirconium titanate (PZT) or PZT with a second doping material, wherein the second doping material is one of La or Nb;
   a relaxor ferroelectric which includes one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
   a perovskite which includes one of: BaTiO3, PbTiO3, KNbO3, or NaTaO3;
   a hexagonal ferroelectric which includes one of: YMnO3 or LuFeO3;
   hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
   hafnium (Hf), Zirconium (Zr), Aluminum (Al), Silicon (Si), their oxides or their alloyed oxides;
   hafnium oxides as Hf1−x Ex Oy, where E can be Al, Ca, Ce, Dy, Er, Gd, Ge, La, Sc, Si, Sr, Sn, or Y;
   Al(1−x)Sc(x)N, Ga(1−x)Sc(x)N, Al(1−x)Y(x)N or Al(1−x−y)Mg(x)Nb(y)N, y doped HfO2, where 'y' includes one of: Al, Ca, Ce, Dy, Er, Gd, Ge, La, Sc, Si, Sr, Sn, or Y, wherein 'x' is a fraction;
   niobate type compounds LiNbO3, LiTaO3, Lithium iron Tantalum Oxy Fluoride, Barium Strontium Niobate, Sodium Barium Niobate, or Potassium strontium niobate; or
   an improper ferroelectric which includes one of: [PTO/STO]n or [LAO/STO]n, where 'n' is between 1 to 100.

15. The apparatus of claim 10, wherein the first fixed input and the second fixed input are coupled to a ground supply rail.

16. A system comprising:
   a processor circuitry to execute one or more instructions;
   a communication interface communicatively coupled to the processor circuitry; and
   a memory coupled to the processor circuitry, wherein the processor circuitry comprises an and-or-inverter gate which includes:
   a first capacitor to receive a first input, wherein the first capacitor is coupled to a first node;
   a second capacitor to receive a second input, wherein the second capacitor is coupled to the first node;
   a third capacitor to receive a third input, wherein the third capacitor is coupled to the first node;
   a fourth capacitor to receive a fourth input, wherein the fourth capacitor is coupled to a second node;
   a fifth capacitor to receive a fifth input, wherein the fifth capacitor is coupled to the second node;
   a sixth capacitor to receive a sixth input, wherein the sixth capacitor is coupled to the second node, wherein the first input, the second input, the fourth input, and the fifth input are variable inputs, and wherein the third input and the sixth input are pulled to a ground supply level; and
   a NOR gate with its inputs which are directly coupled to the first node and the second node, respectively.

17. The system of claim 16, wherein the first capacitor, the second capacitor, the third capacitor, the fourth capacitor, the fifth capacitor, and the sixth capacitor include non-linear polar material.

18. The system of claim 17, wherein the non-linear polar material includes one of:
   ferroelectric material, paraelectric material, or non-linear dielectric.

19. The system of claim 17, wherein the non-linear polar material includes one of:
   bismuth ferrite (BFO) with a first doping material, wherein the first doping material is one of Lanthanum or elements from lanthanide series of periodic table;
   lead zirconium titanate (PZT) or PZT with a second doping material, wherein the second doping material is one of La or Nb;
   a relaxor ferroelectric which includes one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
   a perovskite which includes one of: BaTiO3, PbTiO3, KNbO3, or NaTaO3;
   a hexagonal ferroelectric which includes one of: YMnO3 or LuFeO3;
   hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
   hafnium (Hf), Zirconium (Zr), Aluminum (Al), Silicon (Si), their oxides or their alloyed oxides;
   hafnium oxides as Hf1−x Ex Oy, where E can be Al, Ca, Ce, Dy, Er, Gd, Ge, La, Sc, Si, Sr, Sn, or Y;
   Al(1−x)Sc(x)N, Ga(1−x)Sc(x)N, Al(1−x)Y(x)N or Al(1−x−y)Mg(x)Nb(y)N, y doped HfO2, where 'y' includes one of: Al, Ca, Ce, Dy, Er, Gd, Ge, La, Sc, Si, Sr, Sn, or Y, wherein 'x' is a fraction;
   niobate type compounds LiNbO3, LiTaO3, Lithium iron Tantalum Oxy Fluoride, Barium Strontium Niobate, Sodium Barium Niobate, or Potassium strontium niobate;
   an improper ferroelectric which includes one of: [PTO/STO]n or [LAO/STO]n, where 'n' is between 1 to 100; or SrTiO3, Ba(x)Sr(y)TiO3, HfZrO2, Hf—Si—O, La-substituted PbTiO3, or PMN-PT based relaxor ferroelectrics.

20. The system of claim 16, wherein:
the first input, the second input, and the third input are digital signals;
the first or second node has a voltage such that leakage through the NOR gate is reduced,
the NOR gate is a CMOS based NOR gate;
the first capacitor, the second capacitor, and the third capacitor together operate as a first AND gate; and
the fourth capacitor, the fifth capacitor, and the sixth capacitor together operate as a second AND gate.

\* \* \* \* \*